US012787345B2

(12) United States Patent
Park et al.

(10) Patent No.: US 12,787,345 B2
(45) Date of Patent: Nov. 3, 2026

(54) SEMICONDUCTOR DEVICE INCLUDING A CHANNEL LAYER INCLUDING A TWO-DIMENSIONAL (2D) SEMICONDUCTOR MATERIAL

(71) Applicant: Samsung Electronics Co., Ltd., Suwon-si (KR)

(72) Inventors: Sung Il Park, Suwon-si (KR); Min Jun Lee, Suwon-si (KR); Jae Hyun Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 365 days.

(21) Appl. No.: 18/383,065

(22) Filed: Oct. 24, 2023

(65) Prior Publication Data

US 2024/0258430 A1 Aug. 1, 2024

(30) Foreign Application Priority Data

Jan. 27, 2023 (KR) ........................ 10-2023-0010848

(51) Int. Cl.

*H10D 30/62* (2025.01)
*H10D 30/01* (2025.01)
(Continued)

(52) U.S. Cl.

CPC ....... *H10D 30/6211* (2025.01); *H10D 30/024* (2025.01); *H10D 62/154* (2025.01);
(Continued)

(58) Field of Classification Search

CPC .. H10D 30/024; H10D 30/47; H10D 30/6211; H10D 30/6735; H10D 64/0186;
(Continued)

(56) References Cited

U.S. PATENT DOCUMENTS 9,559,168 B2 1/2017 Lai et al.
10,388,732 B1 8/2019 Frougier et al.
(Continued)

FOREIGN PATENT DOCUMENTS

KR 1020170097322 A 8/2017
KR 1020170102701 A 9/2017
(Continued)

OTHER PUBLICATIONS

European Office Action dated Jun. 4, 2024 for corresponding application No. EP 23 210 993.4.
(Continued)

*Primary Examiner* — Khiem D Nguyen
(74) *Attorney, Agent, or Firm* — Muir Patent Law, PLLC

(57) ABSTRACT

Disclosed is a semiconductor device including a first channel layer on a substrate, and a second channel layer on the first channel layer, the first and second channel layers extending in a first direction while being spaced apart from the substrate, and including a 2D semiconductor material, a gate structure on the substrate, the gate structure extending in a second direction, and being penetrated by the first and second channel layers, and source/drain contacts on side surfaces of the gate structure and being connected to the first and second channel layers. The gate structure includes a first gate portion between the substrate and the first channel layer and having a first gate length, a second gate portion between the first and second channel layers and having a second gate length, and a third gate portion on an upper surface of the second channel layer and having a third gate length.

20 Claims, 37 Drawing Sheets

(51) Int. Cl.
*H10D 62/13* (2025.01)
*H10D 64/01* (2025.01)
*H10D 64/27* (2025.01)

(52) U.S. Cl.
CPC ......... *H10D 62/158* (2025.01); *H10D 64/017* (2025.01); *H10D 64/518* (2025.01)

(58) Field of Classification Search
CPC .. H10D 64/251; H10D 64/258; H10D 64/667; H10D 64/685; H10D 84/0186; H10D 84/85; H10D 64/518
See application file for complete search history.

(56) References Cited

U.S. PATENT DOCUMENTS

| | | | | |
|---|---|---|---|---|
| 10,734,384 | B1 | 8/2020 | Li et al. | |
| 10,991,690 | B2 | 4/2021 | Wang | |
| 2014/0151639 | A1* | 6/2014 | Chang | H10D 30/6757 257/27 |
| 2021/0135015 | A1* | 5/2021 | Frougier | H10D 30/478 |
| 2021/0296445 | A1 | 9/2021 | Lee et al. | |
| 2021/0391478 | A1* | 12/2021 | Maxey | H10D 64/118 |
| 2022/0102499 | A1 | 3/2022 | Naylor et al. | |
| 2022/0149192 | A1 | 5/2022 | Maxey et al. | |
| 2022/0199783 | A1 | 6/2022 | Penumatcha et al. | |
| 2022/0399439 | A1* | 12/2022 | Cheng | H10D 64/018 |
| 2023/0023186 | A1* | 1/2023 | Lin | H10D 62/80 |

FOREIGN PATENT DOCUMENTS

| | | | |
|---|---|---|---|
| KR | 1020190068312 | A | 6/2019 |
| KR | 1020190140564 | A | 12/2019 |
| KR | 1020210104294 | A | 8/2021 |
| KR | 1020210122645 | A | 10/2021 |

OTHER PUBLICATIONS

European Search Report dated May 22, 2024 for corresponding application No. EP 23 210 993.4.

* cited by examiner

SEMICONDUCTOR DEVICE INCLUDING A CHANNEL LAYER INCLUDING A TWO-DIMENSIONAL (2D) SEMICONDUCTOR MATERIAL

CROSS-REFERENCE TO RELATED APPLICATION

This application claims priority under 35 U.S.C. § 119 from Korean Patent Application No. 10-2023-0010848, filed on Jan. 27, 2023, in the Korean Intellectual Property Office, and all the benefits accruing therefrom under 35 U.S.C. § 119, the contents of which in its entirety are herein incorporated by reference.

BACKGROUND

1. Field

The present disclosure relates to a semiconductor device and a method of fabricating the same, and more particularly, to a semiconductor device using a two-dimensional (2D) semiconductor material as channels and a method of fabricating the semiconductor device.

2. Description of the Related Art

As a scaling technique for increasing the density of integrated circuit devices, a multi-gate transistor has been suggested in which a fin- or nanowire-shaped silicon body is formed on a substrate and a gate is formed on the surface of the silicon body.

The multi-gate transistor can be easily scaled up or down because it uses a three-dimensional (3D) channel. Also, an improved current control capability can be provided without the need to increase the gate length of the multi-gate transistor. Also, a short channel effect (SCE) in which the electric potential of a channel region is affected by a drain voltage can be effectively suppressed.

Meanwhile, research has been conducted on semiconductor devices using a two-dimensional (2D) semiconductor material as a channel in order to improve mobility and SCE and thereby improve the performance of semiconductor devices.

SUMMARY

Aspects of the present disclosure provide a semiconductor device having an improved performance by reducing the contact resistance between two-dimensional (2D) semiconductor channels and metal contacts.

Aspects of the present disclosure also provide a method of fabricating a semiconductor device having an improved performance by reducing the contact resistance between 2D semiconductor channels and metal contacts.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a semiconductor device comprising a substrate, a first channel layer on the substrate, the first channel layer extending in a first direction while being spaced apart from the substrate, and including a two-dimensional (2D) semiconductor material, a second channel layer on the first channel layer, the second channel layer extending in the first direction while being spaced apart from the first channel layer, and including the 2D semiconductor material, a gate structure on the substrate, the gate structure extending in a second direction, which is perpendicular to the first direction, and being penetrated by the first and second channel layers, and source/drain contacts on side surfaces of the gate structure, the source/drain contacts being connected to the first and second channel layers, wherein the gate structure includes a first gate portion, which is between the substrate and the first channel layer and has a first gate length, a second gate portion, which is between the first and second channel layers and has a second gate length, and a third gate portion, which is on a upper surface of the second channel layer and has a third gate length, and wherein the first and third gate lengths are greater than, or less than, the second gate length.

According to another aspect of the present disclosure, there is provided a semiconductor device comprising a substrate, a channel layer on the substrate, the first channel layer extending in a first direction while being spaced apart from the substrate, and including a two-dimensional (2D) semiconductor material, a gate structure on the substrate, the gate structure extending in a second direction, which is perpendicular to the first direction, and being penetrated by the channel layer, and source/drain contacts on side surfaces of the gate structure, the source/drain contacts being connected to the channel layers, wherein the gate structure includes a first gate portion, which is on a bottom surface of the channel layer and has a first gate length, and a second gate portion, which is on an upper surface of the channel layer and has a second gate length greater than the first gate length, and wherein the bottom surface of the channel layer includes first horizontal contact surfaces, which are exposed by the first gate portion and are in contact with the source/drain contacts.

According to still another aspect of the present disclosure, there is provided a semiconductor device comprising a substrate, first and second channel layers sequentially stacked on the substrate, spaced apart from each other, extending in a first direction, and including a two-dimensional (2D) semiconductor material, a gate structure on the substrate, the gate structure extending in a second direction, which is perpendicular to the first direction, and being penetrated by the first and second channel layers, gate spacers extending along side surfaces of the gate structure and being penetrated by the first and second channel layers, and source/drain contacts on side surfaces of the gate structure, the source/drain contacts including a metal material, wherein both end portions of each of the first and second channel layers include contact portions, which include the 2D semiconductor material doped with impurities, wherein the gate structure includes first, second, and third gate portions, which are alternately arranged with the first and second channel layers in a third direction perpendicular to an upper surface of the substrate, wherein a first gate length of the first gate portion is less than a second length of the second gate portion, wherein the second gate length of the second gate portion is greater than a third gate length of the third gate portion, and wherein the source/drain contacts are in contact with bottom surfaces of the contact portions of the first channel layers and upper surfaces of the contact portions of the second channel layer.

According to still another aspect of the present disclosure, there is provided a method of fabricating a semiconductor device, comprising providing a substrate, forming first and second channel layers, which are sequentially stacked on the substrate, extend in a first direction, and include a two-dimensional (2D) semiconductor material, forming first, second, and third sacrificial layers, which are stacked alternately on the substrate with the first and second channel layers and extend in the first direction, forming a dummy gate, which extends in a second direction perpendicular to the first direction, on the first and second channel layers and the first, second, and third sacrificial layers, performing a recess process on the first, second, and third sacrificial layers, and forming a gate structure, which replaces the dummy gate and the first, second, and third sacrificial layers, wherein the first and third sacrificial layers have an etch selectivity with respect to the second sacrificial layer, and wherein after the recess process, lengths, in the first direction, of the first and third sacrificial layers are greater than, or less than, a length, in the first direction, of the second sacrificial layer.

It should be noted that the effects of the present disclosure are not limited to those described above, and other effects of the present disclosure will be apparent from the following description.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

It will be understood that, although the terms "first," "second," "upper," "lower," and the like may be used herein to describe various elements, these elements should not be limited by these terms. These terms are only used to distinguish one element from another. Thus, a "first" element discussed below could also be termed a "second" element without departing from the teachings of the present disclosure. Similarly, a "lower" element discussed below could also be termed an "upper element" without departing from the teachings of the present disclosure.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Semiconductor devices according to example embodiments of the present disclosure will hereinafter be described with reference to FIGS. 1 to 17.

Figure 1:
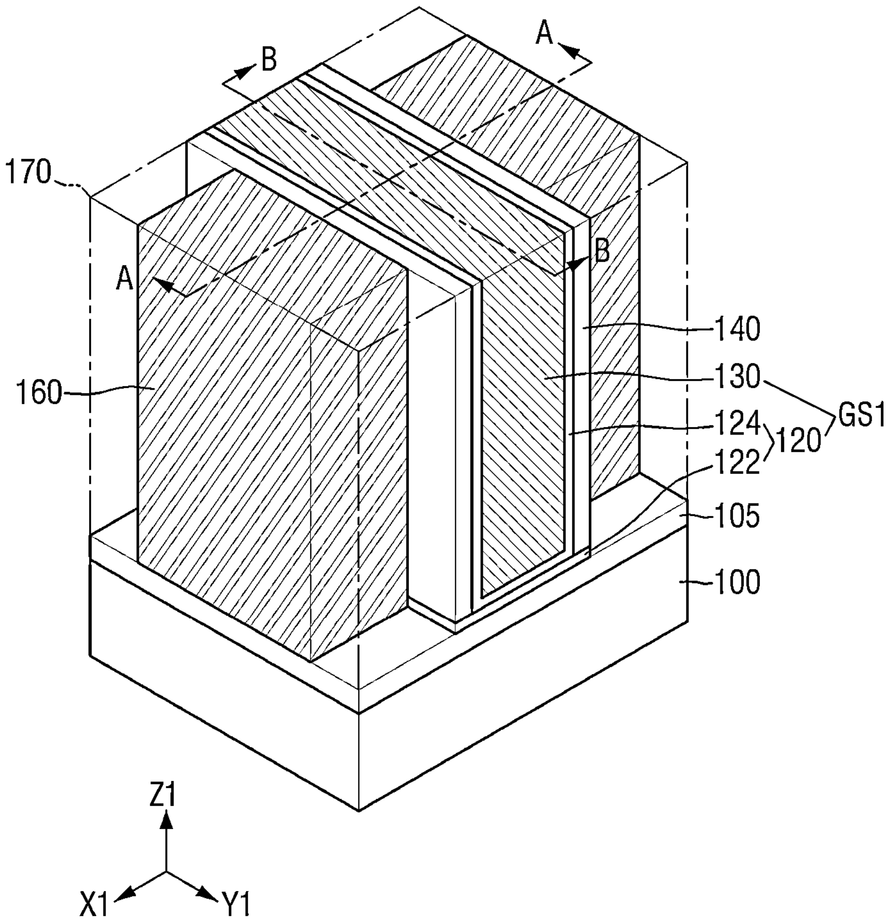
FIG. 1 is a perspective view of a semiconductor device according to example embodiments of the present disclosure.
Figure 2:
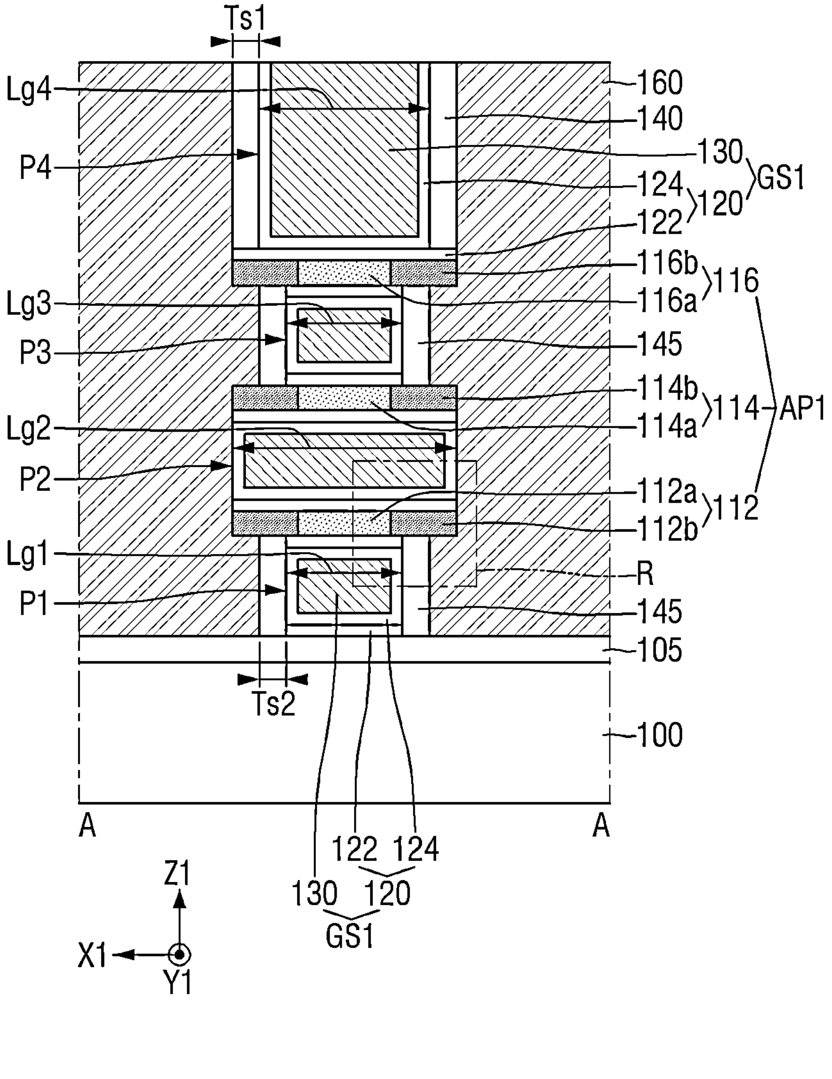
FIG. 2 is a cross-sectional view taken along line A-A of FIG. 1.
Figure 3:
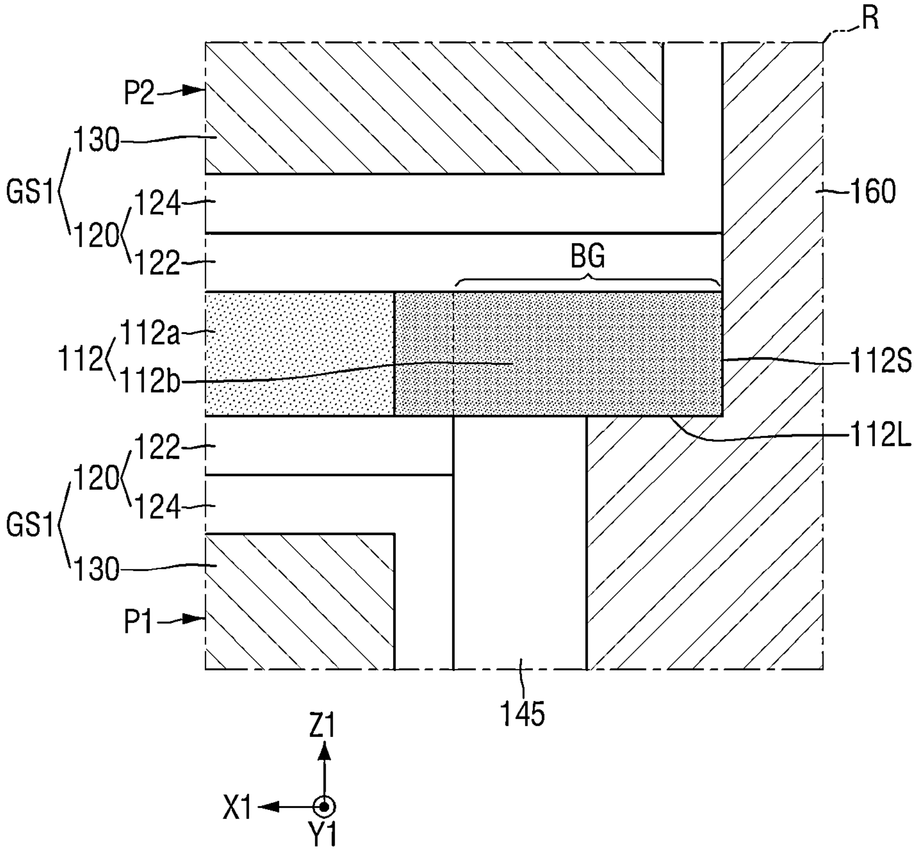
FIG. 3 is an enlarged cross-sectional view of an example of a region R of FIG. 2.
Figure 4A:
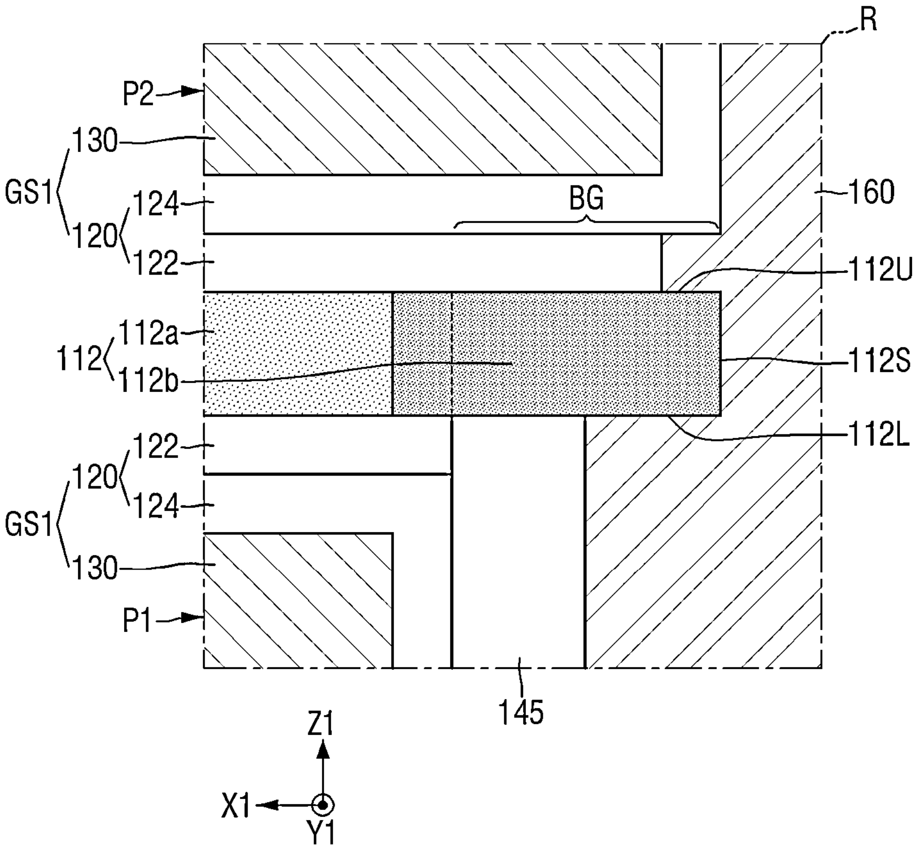
FIGS. 4A to 4C are enlarged cross-sectional views of other examples of the region R of FIG. 2.
Figure 4B:
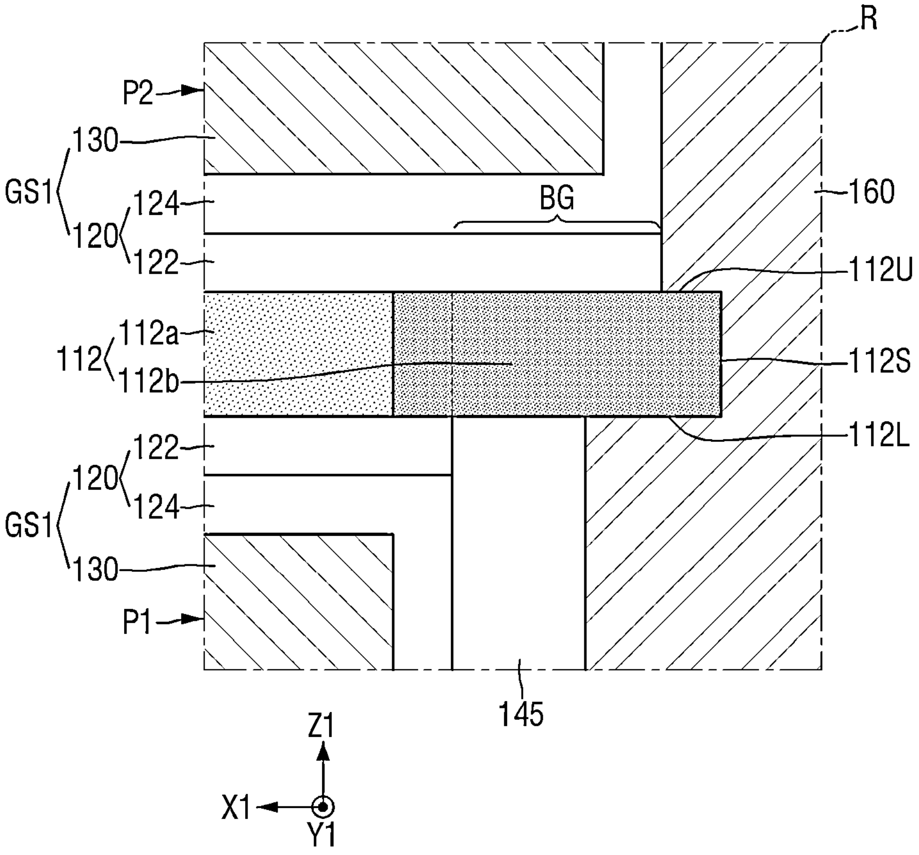
Figure 4C:
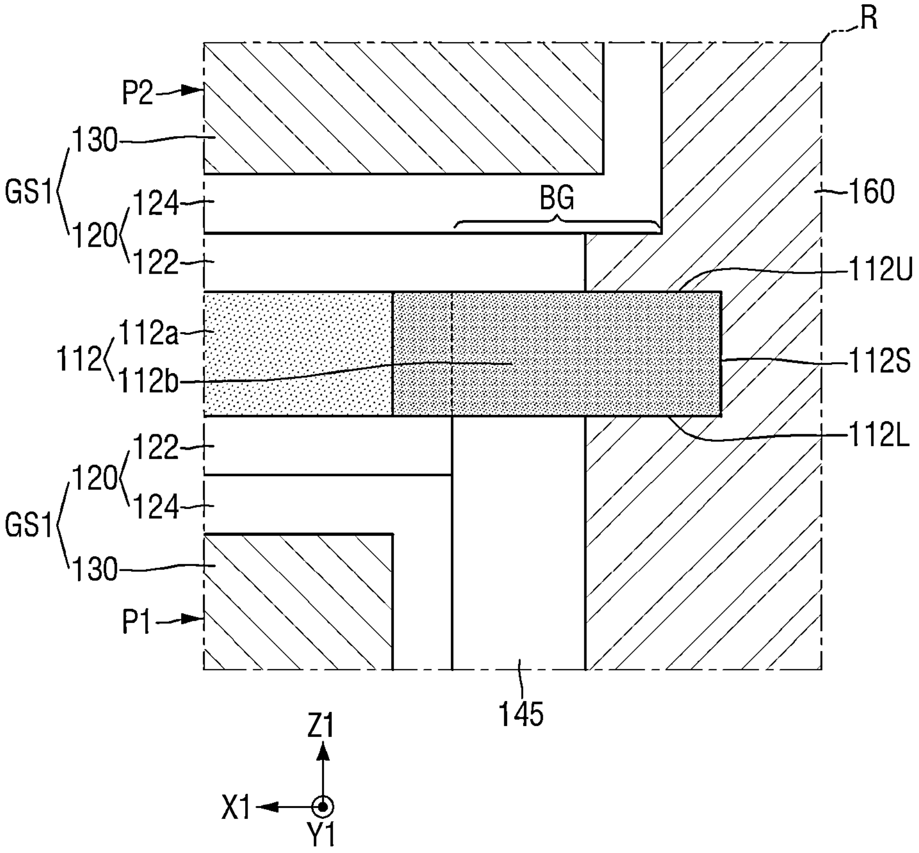
Figure 5:
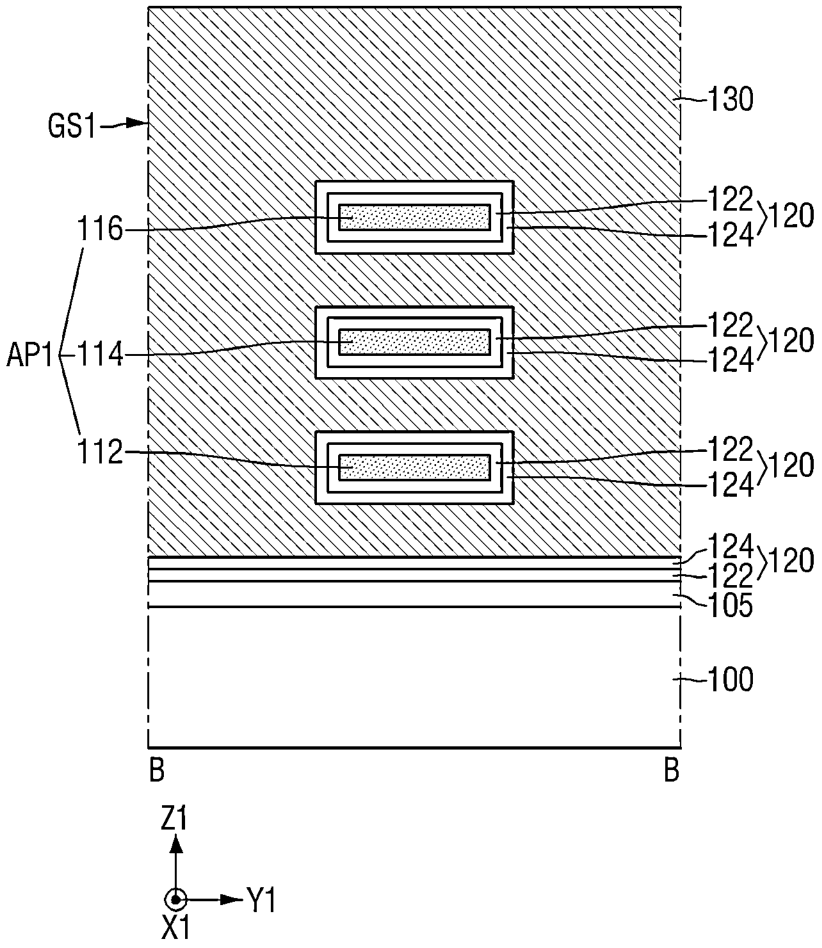
FIG. 5 is a cross-sectional view taken along line B-B of FIG. 1.
Figure 6:
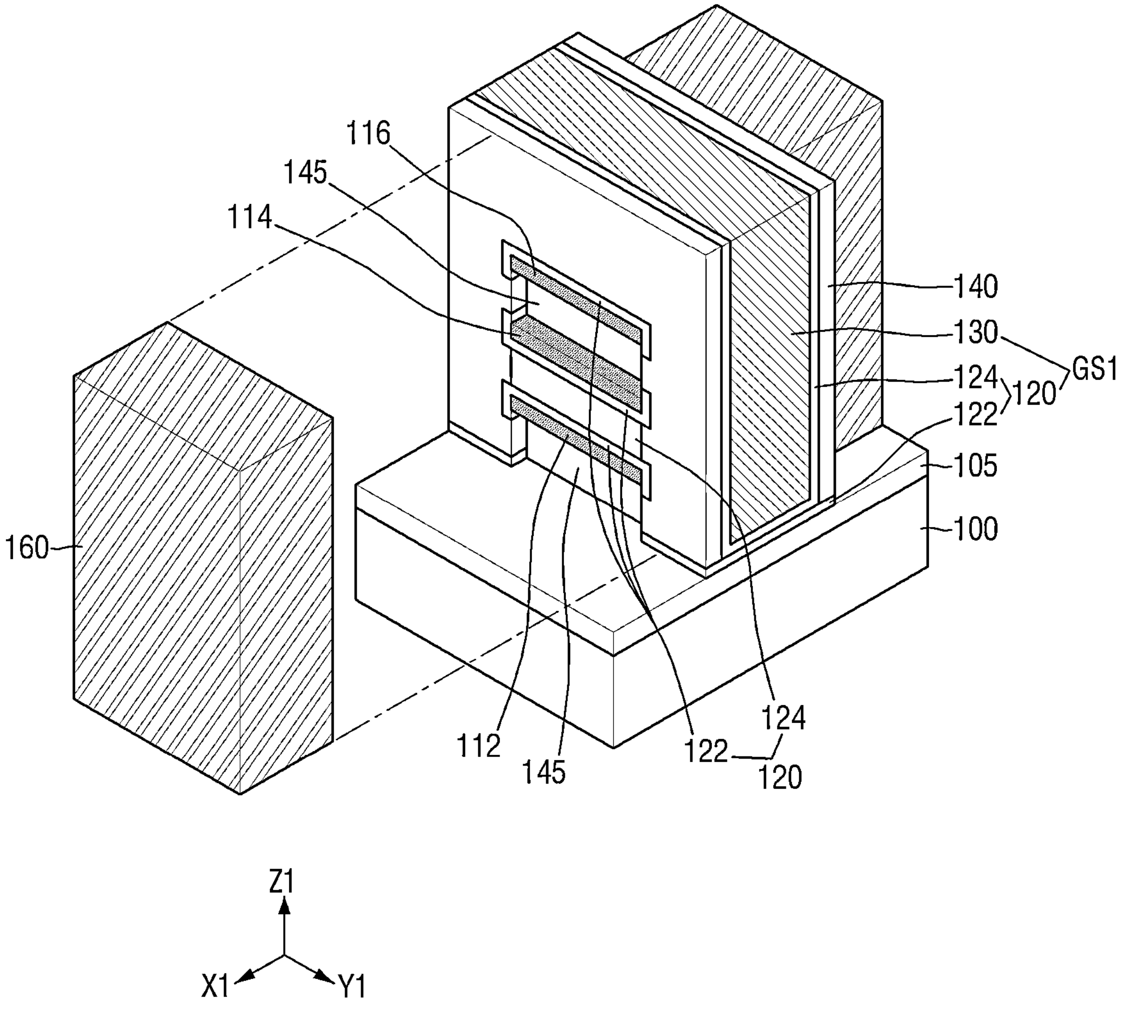
FIG. 6 is an exploded perspective view of the semiconductor device of FIGS. 2 to 5.

FIG. 1 is a perspective view of a semiconductor device according to example embodiments of the present disclosure. FIG. 2 is a cross-sectional view taken along line A-A of FIG. 1. FIG. 3 is an enlarged cross-sectional view of an example of a region R of FIG. 2. FIGS. 4A to 4C are enlarged cross-sectional views of other examples of the region R of FIG. 2. FIG. 5 is a cross-sectional view taken along line B-B of FIG. 1. FIG. 6 is an exploded perspective view of the semiconductor device of FIGS. 2 to 5.

Referring to FIGS. 1 to 6, the semiconductor device according to example embodiments of the present disclosure includes a substrate 100, a first separation insulating film 105, a first active pattern AP1, a first gate structure GS1, first gate spacers 140, first source/drain contacts 160, and a first interlayer insulating film 170.

The substrate 100 may be a bulk silicon substrate or a silicon-on-insulator (SOI) substrate. Alternatively, the substrate 100 may be a silicon substrate or may include silicon germanium, silicon germanium-on-insulator (SGOI), indium antimonide, lead tellurium compounds, indium arsenic, indium phosphide, gallium arsenic, or gallium antimonide. Alternatively, the substrate 100 may be an epitaxial layer formed on a base substrate. For convenience, the substrate 100 will hereinafter be described as being a silicon substrate. The first separation insulating film 105 may be formed on the substrate 100. The first separation insulating film 105 may cover at least part of the upper surface of the substrate 100. The first separation insulating film 105 may contact at least part of the upper surface of the substrate 100. The first separation insulating film 105 may include an insulating material such as at least one of, for example, silicon nitride, silicon nitride, silicon oxynitride, silicon oxycarbide, silicon boron nitride, silicon carbonitride, silicon oxycarbonitride, and a combination thereof, but the present disclosure is not limited thereto. For example, the first separation insulating film 105 may include a silicon nitride film.

The first active pattern AP1 may be formed on the substrate 100 and the first separation insulating film 105. The first active pattern AP1 may be spaced apart from the substrate 100 and the first separation insulating film 105. The first active pattern AP1 may extend lengthwise in a first direction X1, which is parallel to the upper surface of the substrate 100.

The first active pattern AP1 may include a plurality of channel layers (e.g., channel layers 112, 114, and 116), which are sequentially disposed on the first separation insulating film 105 and are spaced apart from one another. For example, the first active pattern AP1 may include a first channel layer 112, which is spaced apart from the substrate 100, a second channel layer 114, which is spaced further apart than the first channel layer 112 from the substrate 100, and a third channel layer 116, which is spaced further apart than the second channel layer 114 from the substrate 100. The channel layers 112, 114, and 116 may be used as the channel regions of a multibridge channel field-effect transistor (MBCFET®) including multibridge channels.

The channel layers 112, 114, and 116 may include a two-dimensional (2D) semiconductor material. The 2D semiconductor material may include, for example, graphene, carbon nanotubes (CNTs), a transition metal dichalcogenide (TMD), or a combination thereof. A TMD may contain one metal element from among Mo, W, Nb, V, Ta, Ti, Zr, Hf, Tc, Re, Cu, Ga, In, Sn, Ge, and Pb and one chalcogen element from among S, Se, and Te. Each of the channel layers 112, 114, and 116 may include a single layer or a multilayer of the 2D semiconductor material. In some embodiments, the channel layers 112, 114, and 116 may include a TMD.

In some embodiments, the channel layers 112, 114, and 116 may include first central portions 112*a*, 114*a*, and 116*a* and first contact portions 112*b*, 114*b*, and 116*b*. The first central portions 112*a*, 114*a*, and 116*a* may include the 2D semiconductor material. The first contact portions 112*b*, 114*b*, and 116*b* may be disposed at both ends of the respective first central portions 112*a*, 114*a*, and 116*a*. The first contact portions 112*b*, 114*b*, and 116*b* may include the 2D semiconductor material doped with impurities. For example, the first contact portions 112*b*, 114*b*, and 116*b* may be regions at both ends of the respective channel layers 112, 114, and 116 that are doped with impurities.

In a case where the first active pattern AP1 is used as the channel regions of a p-type field-effect transistor (PFET), the first contact portions 112*b*, 114*b*, and 116*b* may include the 2D semiconductor material (e.g., a TMD) doped with a p-type dopant. The p-type dopant may include at least one of, for example, rhenium (Re), manganese (Mn), iron (Fe), cobalt (Co), copper (Cu), and chlorine (CI), but the present disclosure is not limited thereto.

In a case where the first active pattern AP1 is used as the channel regions of an n-type field-effect transistor (NFET), the first contact portions 112*b*, 114*b*, and 116*b* may include the 2D semiconductor material (e.g., a TMD) doped with an n-type dopant. The n-type dopant may include at least one of, for example, niobium (Nb), zinc (Zn), nitrogen (N), phosphorus (P) and oxygen (O), but the present disclosure is not limited thereto.

The impurity doping concentration of the first contact portions 112*b*, 114*b*, and 116*b* may be, for example, about 1E18 $cm^{-3}$ or greater. In example embodiments, the impurity doping concentration of the first contact portions 112*b*, 114*b*, and 116*b* may be about 1E20 $cm^{-3}$ or greater. For example, the impurity doping concentration of the first contact portions 112*b*, 114*b*, and 116*b* may be about 1E20 $cm^{-3}$ to about 5E20 $cm^{-3}$.

The first gate structure GS1 may be formed on the substrate 100 and the first separation insulating film 105. The first gate structure GS1 may intersect the first active pattern AP1. The first gate structure GS1 may overlap the first active pattern AP1. For example, the first gate structure GS1 may extend lengthwise in a second direction Y1, which is parallel to the upper surface of the substrate 100 and is perpendicular to the first direction X1. The channel layers 112, 114, and 116 of the first active pattern AP1 may extend lengthwise in the first direction X1 and may thus penetrate the first gate structure GS1. For example, the first gate structure GS1 may surround each of the channel layers 112, 114, and 116.

The first gate structure GS1 may include a first gate dielectric film 120 and a first gate electrode 130. The first gate dielectric film 120 and the first gate electrode 130 may be sequentially stacked on each of the channel layers 112, 114, and 116.

The first gate dielectric film 120 may be interposed between the first gate electrode 130 and the channel layers 112, 114, and 116. For example, the first gate dielectric film 120 may surround each of the channel layers 112, 114, and 116. The first gate dielectric film 120 may be interposed between the first separation insulating film 105 and the first gate electrode 130.

The first gate dielectric film 120 may include a dielectric material such as at least one of, for example, silicon oxide, silicon oxynitride, silicon nitride, and a high-k material having a greater dielectric constant than silicon oxide. The high-k material may include at least one of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and a combination thereof, but the present disclosure is not limited thereto.

The first gate electrode 130 may be stacked on the first gate dielectric film 120. The first gate electrode 130 may surround each of the channel layers 112, 114, and 116.

The first gate electrode 130 may include a conductive material such as, for example, at least one of TiN, WN, TaN, Ru, TiC, TaC, Ti, Ag, Al, TiAl, TiAIN, TiAIC, TaCN, TaSIN, Mn, Zr, W, and a combination thereof, but the present disclosure is not limited thereto. The first gate electrode 130 may be formed by a replacement process, but the present disclosure is not limited thereto.

The first gate electrode 130 is illustrated as being a single film, but the present disclosure is not limited thereto. Alternatively, the first gate electrode 130 may be formed by stacking a plurality of conductive layers. For example, the first gate electrode 130 may include a work function control function, which controls the work function of the first gate electrode 130, and a filling conductive film, which fills the space formed by the work function control film. The work function control film may include at least one of, for example, TiN, TaN, TiC, TaC, TiAIC, and a combination thereof, but the present disclosure is not limited thereto. The filling conductive film may include, for example, W or Al, but the present disclosure is not limited thereto.

In some embodiments, the first gate electrode 130 may be electrically separated from the substrate 100 by the first separation insulating film 105. For example, the first separation insulating film 105 may completely cover the upper surface of the substrate 100.

The first gate spacers 140 may be formed on the substrate 100 and the first separation insulating film 105. The first gate spacers 140 may also be formed on the side surfaces of the first gate structure GS1. For example, the first gate spacers 140 may extend lengthwise in the second direction Y1 along the side surfaces of the first gate structure GS1. The channel layers 112, 114, and 116 may extend in the first direction X1 and may thus penetrate the first gate spacers 140.

The first gate spacers 140 may include an insulating material such as at least one of, for example, silicon nitride, silicon oxynitride, silicon oxycarbide, silicon boron nitride, silicon carbonitride, silicon oxycarbonitride, and a combination thereof, but the present disclosure is not limited thereto.

In some embodiments, the first gate dielectric film 120 may include first and second sub-dielectric films 122 and 124, which are sequentially stacked on each of the channel layers 112, 114, and 116.

The first sub-dielectric film 122 may surround each of the channel layers 112, 114, and 116. For example, the first sub-dielectric film 122 may extend conformally along the channel layers 112, 114, and 116. In some embodiments, as illustrated in FIGS. 2 and 6, parts of the first sub-dielectric film 122 may be interposed between the channel layers 112, 114, and 116 and the first gate spacers 140. In example embodiments, the first gate spacers 140 may contact side surfaces of the first sub-dielectric film 122. In some embodiments, the first gate spacers 140 may be aligned in the vertical direction with side surfaces of the first contact portions 116*b* of the third channel layer 116 and with side surfaces of the first sub-dielectric film 122 formed on the third channel layer 116.

The second sub-dielectric film 124 may surround the first sub-dielectric film 122. In some embodiments, as illustrated in FIGS. 2 and 6, parts of the second sub-dielectric film 124 may be interposed between the first gate electrode 130 and the first gate spacers 140. For example, the second sub-dielectric film 124 may extend conformally along the first sub-dielectric film 122 and the profile of the inner surfaces of the first gate spacers 140. In example embodiments, the first gate spacers 140 may contact a portion of an upper surface of the second sub-dielectric film 124.

The first and second sub-dielectric films 122 and 124 may include the same dielectric material or different dielectric materials. The first and second sub-dielectric films 122 and 124 are illustrated as having physical boundaries therebetween, but the present disclosure is not limited thereto. Alternatively, no physical boundary may exist between the first and second sub-dielectric films 122 and 124. In other embodiments, one of the first and second sub-dielectric films 122 and 124 may not be provided.

The first sub-dielectric film 122 may include at least one of, for example, aluminum oxide ($Al_2O_3$), hexagonal boron nitride (hBN), and silicon oxide ($SiO_2$), but the present disclosure is not limited thereto.

The second sub-dielectric film 124 may include at least one of, for example, $Al_2O_3$, hafnium oxide ($HfO_2$), and calcium fluoride ($CaF_2$), but the present disclosure is not limited thereto.

The first gate structure GS1 may include a plurality of gate portions (e.g., gate portions P1 through P4), which are alternately arranged with the channel layers 112, 114, and 116. For example, the first gate structure GS1 may include first to fourth gate portions P1 to P4, which are alternately arranged with the first, second, and third channel layers 112, 114, and 116 in a third direction Z1. For example, the first channel layer 112 may be interposed between the first and second gate portions P1 and P2, the second channel layer 114 may be interposed between the second and third gate portions P2 and P3, and the third channel layer 116 may be interposed between the third and fourth gate portions P3 and P4.

The gate portions P1 to P4 may have gate lengths that alternate in the third direction Z1 with respect to the channel layers 112, 114, and 116. Here, the term "gate length" refers to the length, in the first direction X1, of the first gate structure GS1 adjacent to the first active pattern AP1. For example, the first gate portion P1 may have a first gate length Lg1 in the first direction X1, the second gate portion P2 may have a second gate length Lg2 in the first direction X1, which is greater than the first gate length Lg1 in the first direction X1, and the third gate portion P3 may have a third gate length Lg3 in the first direction X1, which is less than the second gate length Lg2.

The first and third gate lengths Lg1 and Lg3 may be the same, but the present disclosure is not limited thereto. Alternatively, the first and third gate lengths Lg1 and Lg3 may be different. In some embodiments, the fourth gate portion P4 may have a fourth gate length Lg4 in the first direction X1, which is greater than the third gate length Lg3.

As the gate portions P1 to P4 have alternating gate lengths, parts of the bottom or upper surface of each of the channel layers 112, 114, and 116 may be exposed by part of the first gate structure GS1 having a relatively small gate length. For example, parts of the bottom surface of the first channel layer 112 may be exposed by the first gate portion P1, parts of the upper surface of the second channel layer 114 may be exposed by the second gate portion P2, and parts of the bottom surface of the third channel layer 116 may be exposed by the third gate portion P3. In some embodiments, the first gate structure GS1 may expose at least parts of each of the first contact portions 112*b*, 114*b*, and 116*b* of the channel layers 112, 114, and 116.

Also, as the gate portions P1 to P4 have alternating gate lengths, each of the channel layers 112, 114, and 116 may include back gate regions BG. For example, as illustrated in FIG. 3, the first channel layer 112 may include back gate regions BG, which do not overlap in the third direction Z1 with the first gate portion P1 and overlap in the third direction Z1 with the second gate portion P2. The second gate portion P2 may be provided as a back gate for the back gate regions BG of the first channel layers 112.

In some embodiments, each of the first contact portions 112*b*, 114*b*, and 116*b* of the channel layers 112, 114, and 116 may include the back gate regions BG. For example, the back gate regions BG may include the 2D semiconductor material doped with impurities.

In some embodiments, first inner spacers 145 may be formed on the side surfaces of the first gate structure GS1. The first inner spacers 145 may be formed on the side surfaces of each part of the first gate structure GS1 having a relatively small gate length. For example, the first inner spacers 145 may be formed on the side surfaces of each of the first and third gate portions P1 and P3. In some embodiments, the first inner spacers 145 may not be formed on the side surfaces of the second gate portion P2. The first inner spacers 145 formed on the side surfaces of the first gate portions P1 may contact lower surfaces of the first contact portions 112*b* of the first channel layer 112, and the first inner spacers 145 formed on the side surfaces of the third gate portions P3 may contact lower surfaces of the first contact portions 116*b* of the third channel layer 116 and upper surfaces of the first contact portions 114*b* of the second channel layer 114.

The first inner spacers 145 may include an insulating material such as at least one of, for example, silicon nitride, silicon oxynitride, silicon oxycarbide, silicon boron nitride, silicon carbonitride, silicon oxycarbonitride, and a combination thereof, but the present disclosure is not limited thereto.

The first inner spacers 145 may include the same insulating material as, or a different insulating material from, the first gate spacers 140. For example, the first inner spacers 145 may have a different dielectric constant from the first gate spacers 140.

A thickness Ts1 in the first direction X1 of the first gate spacers 140 and a thickness Ts2 in the first direction X1 of the first inner spacers 145 are illustrated as being the same, but the present disclosure is not limited thereto. Alternatively, the thickness Ts1 in the first direction X1 of the first gate spacers 140 and the thickness Ts2 in the first direction X1 of the first inner spacers 145 may be different.

The first inner spacers 145 may expose parts of the bottom or upper surface of each of the channel layers 112, 114, and 116. For example, the thickness Ts2 in the first direction X1 of the first inner spacers 145 may be controlled such that part of the bottom surface of the first channel layer 112, part of the upper surface of the second channel layer 114, and part of the bottom surface of the third channel layer 116 may be exposed.

The first source/drain contacts 160 may be formed on the substrate 100 and the first separation insulating film 105. The first source/drain contacts 160 may also be formed on at least one side surface (e.g., on both side surfaces) of the first gate structure GS1. For example, the first source/drain contacts 160 may extend lengthwise in the third direction Z1, which is perpendicular to the upper surface of the substrate 100, on the side surface(s) of the first gate structure GS1.

The first source/drain contacts 160 may be connected to at least one end portion of each of the channel layers 112, 114, and 116. For example, the channel layers 112, 114, and 116 may be connected to the first source/drain contacts 160 through the first gate structure GS1 and the first gate spacers 140. The first source/drain contacts 160 may be electrically isolated from the first gate electrode 130 by the first gate dielectric film 120, the first gate spacers 140 and/or the first inner spacers 145.

As the gate portions P1 to P4 have alternating gate lengths, the first source/drain contacts 160 may be in contact with parts of the bottom or upper surfaces of each of the channel layers 112, 114, and 116. For example, as illustrated in FIG. 3, the first channel layer 112 may include first horizontal contact surfaces 112L and vertical contact surfaces 112S. The first horizontal contact surfaces 112L may be parts of the bottom surface of the first channel layer 112 exposed by the first gate portion P1 and/or the first inner spacers 145. The vertical contact surfaces 112S may be the side surfaces of the first channel layer 112 that intersect the first direction X1. The first source/drain contacts 160 may be in contact with the first horizontal contact surfaces 112L and the vertical contact surfaces 112S of the first channel layer 112.

In some embodiments, the first source/drain contacts 160 may be in contact with the first contact portions 112*b*, 114*b*, and 116*b* of the channel layers 112, 114, and 116. For example, as illustrated in FIG. 3, the first channel layer 112 may include the first horizontal contact surfaces 112L and the vertical contact surfaces 112S.

The first source/drain contacts 160 may include a metal material such as, for example, nickel (Ni), palladium (Pd), gold (Au), titanium (Ti), silver (Ag), aluminum (Al), tungsten (W), Cu, Mn, or zirconium (Zr), but the present disclosure is not limited thereto.

In some embodiments, parts of the bottom or upper surface of each of the channel layers 112, 114, and 116 may be exposed by part of the first gate structure GS1 having a relatively large gate length. For example, as illustrated in FIGS. 4A to 4C, the first channel layer 112 may further include second horizontal contact surfaces 112U. The second horizontal contact surfaces 112U may be parts of the upper surface of the first channel layer 112 exposed by the second gate portion P2. The first source/drain contacts 160 may be in contact with the first horizontal contact surfaces 112L, the second horizontal contact surfaces 112U, and the vertical contact surfaces 112S of the first channel layer 112.

In some embodiments, as illustrated in FIG. 4A, parts of the first sub-dielectric film 122 may be further recessed toward the first central portions 112*a*, 114*a*, and 116*a*, as compared to the second sub-dielectric film 124, to form the second horizontal contact surfaces 112U. In some embodiments, as illustrated in FIG. 4B, the first and second sub-dielectric films 122 and 124 may be recessed toward the first central portions 112*a*, 114*a*, and 116*a*, as compared to the first channel layer 112, and parts of the first sub-dielectric film 122 may be further recessed toward the first central portions 112*a*, 114*a*, and 116*a*, as compared to the second sub-dielectric film 124, to form the second horizontal contact surfaces 112U.

The first interlayer insulating film 170 may be formed on the substrate 100 and the first separation insulating film 105. The first interlayer insulating film 170 may be formed to fill the spaces on the outer surfaces of the first gate spacers 140 and on the outer surfaces of the first source/drain contacts 160. For example, the first interlayer insulating film 170 may contact the outer surfaces of the first gate spacers 140 and the outer surfaces of the first source/drain contacts 160. The first interlayer insulating film 170 is illustrated as exposing the upper surface of the first gate structure GS1, but the present disclosure is not limited thereto. Alternatively, the first interlayer insulating film 170 may cover the upper surface of the first gate structure GS1.

The first interlayer insulating film 170 may include at least one of, for example, silicon oxide, silicon nitride, silicon oxynitride, and a low-k dielectric material. The low-k dielectric material may include at least one of, for example, flowable oxide (FOX), tonen silazene (TOSZ), undoped silicate glass (USG), borosilicate glass (BSG), phosphosilicate glass (PSG), borophosphosilicate glass (BPSG), plasma-enhanced tetra-ethyl-ortho-silicate (PETEOS), fluoride silicate glass (FSG), carbon-doped silicon oxide (CDO), Xerogel, Aerogel, amorphous fluorinated carbon, organo silicate glass (OSG), parylene, bis-benzocyclobutene (BCB), SiLK, polyimide, a porous polymeric material, and a combination thereof, but the present disclosure is not limited thereto.

As a way to improve mobility and a short channel effect (SCE) and thereby improve the performance of a semiconductor device, research has been conducted on a semiconductor device using the 2D semiconductor material (e.g., a TMD) as a channel. In the semiconductor device using the 2D semiconductor material as channels, no particular source/drain regions (e.g., impurity semiconductor regions) may be formed. In this case, however, as source/drain contacts including a metal may form Schottky contacts by being in direct contact with the channels, which includes a semiconductor material, a high contact resistance may be generated between the channels and the source/drain contacts.

The channels may be connected to the source/drain contacts by being in contact with the source/drain contacts on the side surfaces thereof, i.e., through edge contacts, or by being in contact with the source/drain contacts on the upper or bottom surfaces thereof, i.e., through top contacts. Due to their contact area, top contacts are known to be more favorable than edge contacts in terms of contact resistance. As the semiconductor device according to some embodiments of the present disclosure provides alternating gate lengths for the channel layers 112, 114, and 116, not only edge contacts, but also top contacts can be formed between the channel layers 112, 114, and 116 and the first source/drain contacts 160.

Specifically, as already mentioned above, as the gate portions P1 to P4 have alternating gate lengths, parts of the bottom or upper surface of each of the channel layers 112, 114, and 116 may be exposed by the first gate structure GS1. The channel layers 112, 114, and 116 may be in contact (i.e., form edge contacts) with the first source/drain contacts 160 on a plane intersecting the first direction X1 and may also be in contact (i.e., form top contacts) with the first source/drain contacts 160 on a plane intersecting the third direction Z1. For example, as illustrated in FIG. 3, the first channel layer 112 may include not only the first horizontal contact surfaces 112L, which form edge contacts with the first source/drain contacts 160, but also the vertical contact surfaces 112S, which form top contacts with the first source/drain contacts 160. In this manner, the performance of the semiconductor device according to example embodiments of the present disclosure can be improved by reducing contact resistance, as compared to a semiconductor device providing only edge contacts between channels and source/drain contacts.

Also, it is known that in a semiconductor device using a 2D semiconductor material as channels, the contact resistance between the channels and source/drain contacts is lowered when a back gate voltage is applied to the areas of contact between the channels and the source/drain contacts. As the semiconductor device according to example embodiments of the present disclosure provides alternating gate lengths for the channel layers 112, 114, and 116, a back gate voltage can be applied to the areas of contact between the channel layers 112, 114, and 116 and the first source/drain contacts 160.

Specifically, as already mentioned above, as the gate portions P1 to P4 have alternating gate lengths, each of the channel layers 112, 114, and 116 may include the back gate regions BG, which are in contact with the first source/drain contacts 160, and may receive a back gate voltage from the back gate regions BG. For example, as illustrated in FIG. 3, first contact portions 112*b* of the first channel layer 112 may receive a back gate voltage from the second gate portion P2. In this manner, the performance of the semiconductor device according to example embodiments of the present disclosure can be further improved.

Figure 7:
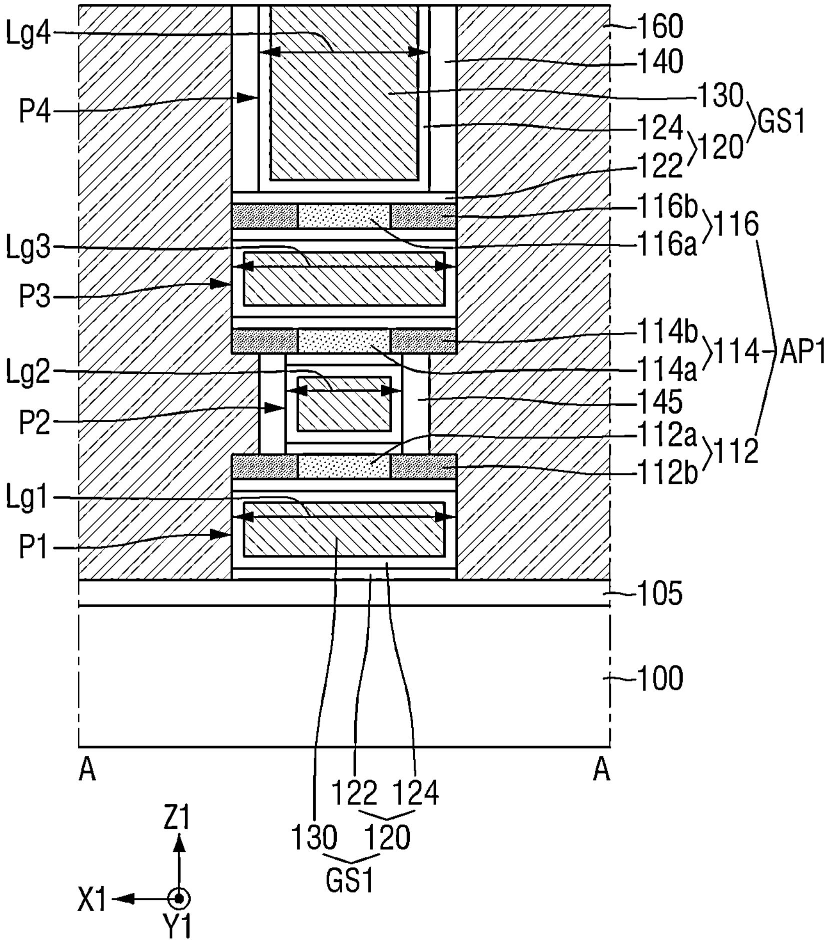
FIG. 7 is a cross-sectional view of a semiconductor device according to example embodiments of the present disclosure.
Figure 8:
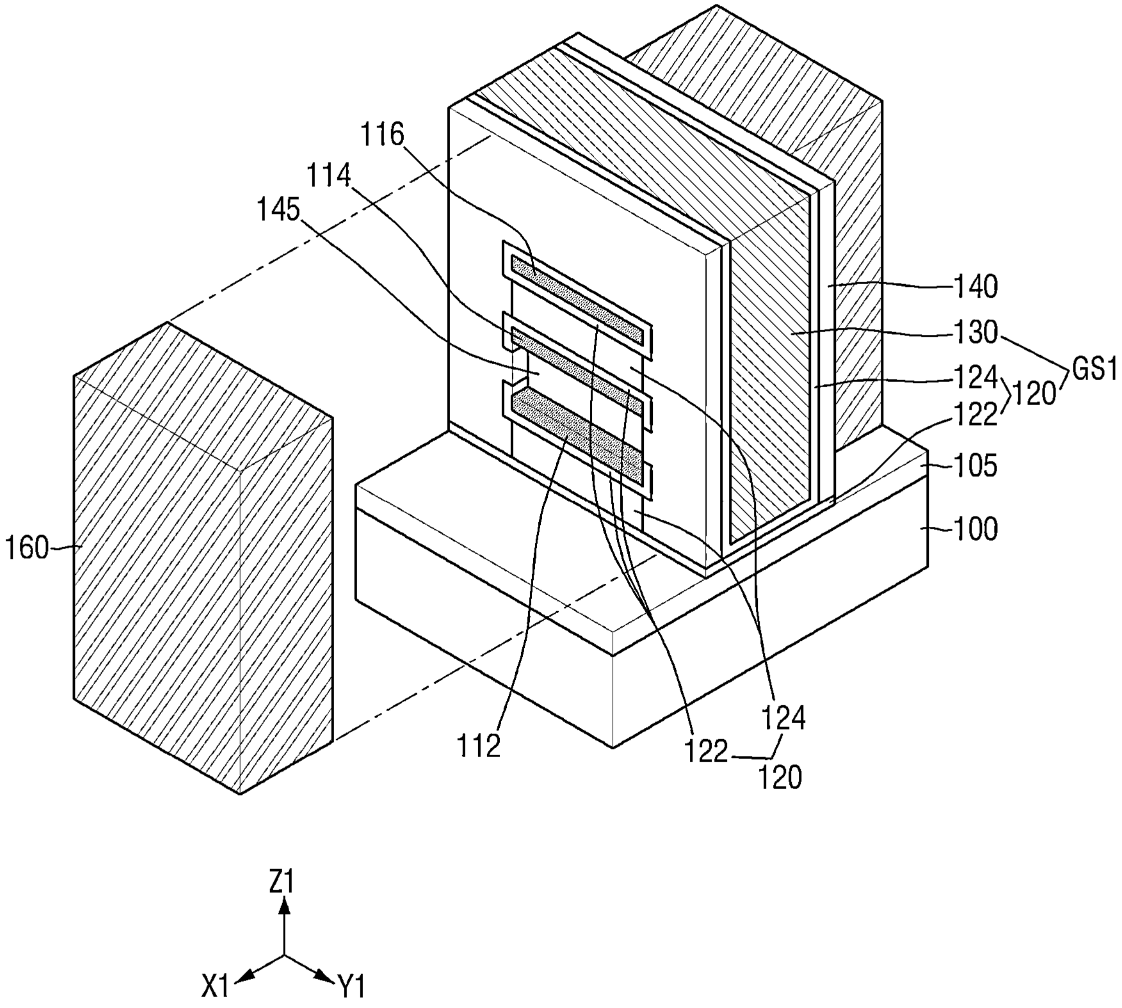
FIG. 8 is an exploded perspective view of the semiconductor device of FIG. 7.

FIG. 7 is a cross-sectional view of a semiconductor device according to example embodiments of the present disclosure. FIG. 8 is an exploded perspective view of the semiconductor device of FIG. 7. For convenience, the embodiment of FIGS. 7 and 8 will hereinafter be described, focusing mainly on the differences with the embodiment of FIGS. 1 to 6.

Referring to FIGS. 7 and 8, a second gate length Lg2 in the first direction X1 may be less than a first gate length Lg1 in the first direction X1, and a third gate length Lg3 in the first direction X1 may be greater than the second gate length Lg2 in the first direction X1.

Accordingly, parts of the upper surface of a first channel layer 112 and parts of the bottom surface of a second channel layer 114 may be exposed by a second gate portion P2. The parts of the upper surface of the first channel layer 112 and the parts of the bottom surface of the second channel layer 114 may form top contacts by being in contact with first source/drain contacts 160.

In some embodiments, first inner spacers 145 may be formed on the side surfaces of the second gate portion P2. In some embodiments, the first inner spacers 145 may not be formed on the side surfaces of a first or third gate portion P1 or P3.

The first and third gate lengths Lg1 and Lg3 are illustrated as being the same, but the present disclosure is not limited thereto. Alternatively, the first and third gate lengths Lg1 and Lg3 may be different. In some embodiments, a fourth gate length Lg4 in the first direction X1 may be less than the third gate length Lg3.

Figure 9:
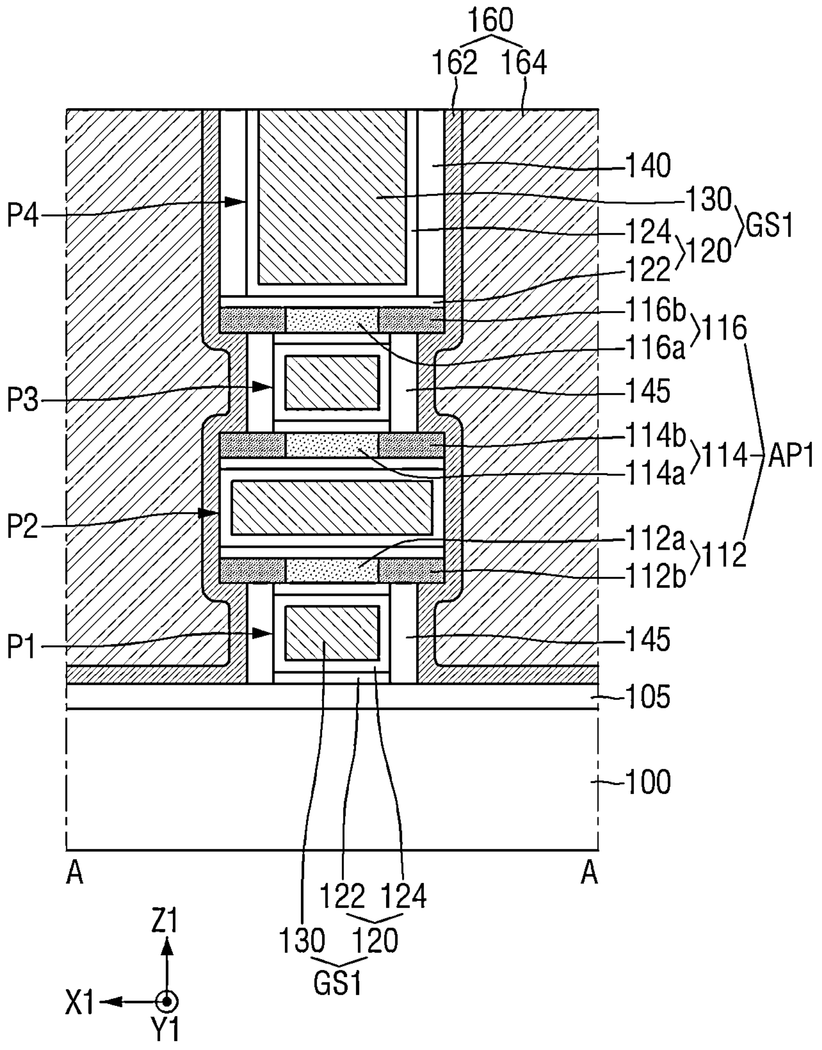
FIGS. 9 to 11 are cross-sectional views of semiconductor devices according to example embodiments of the present disclosure.
Figure 10:
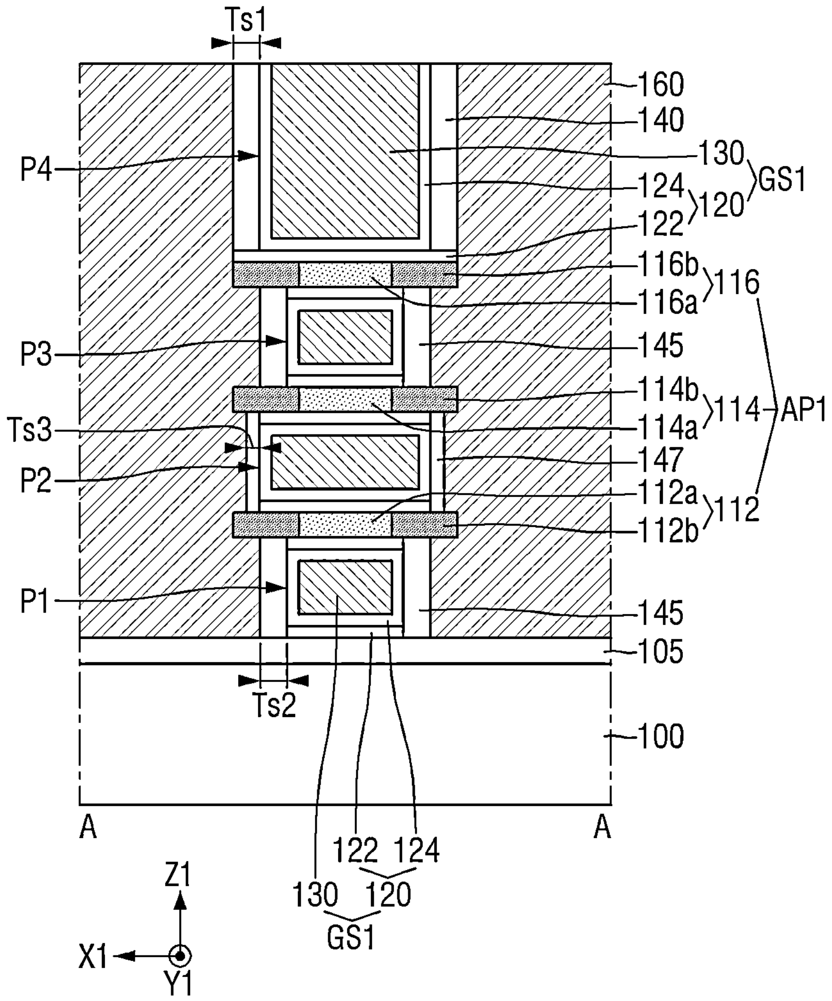
Figure 11:
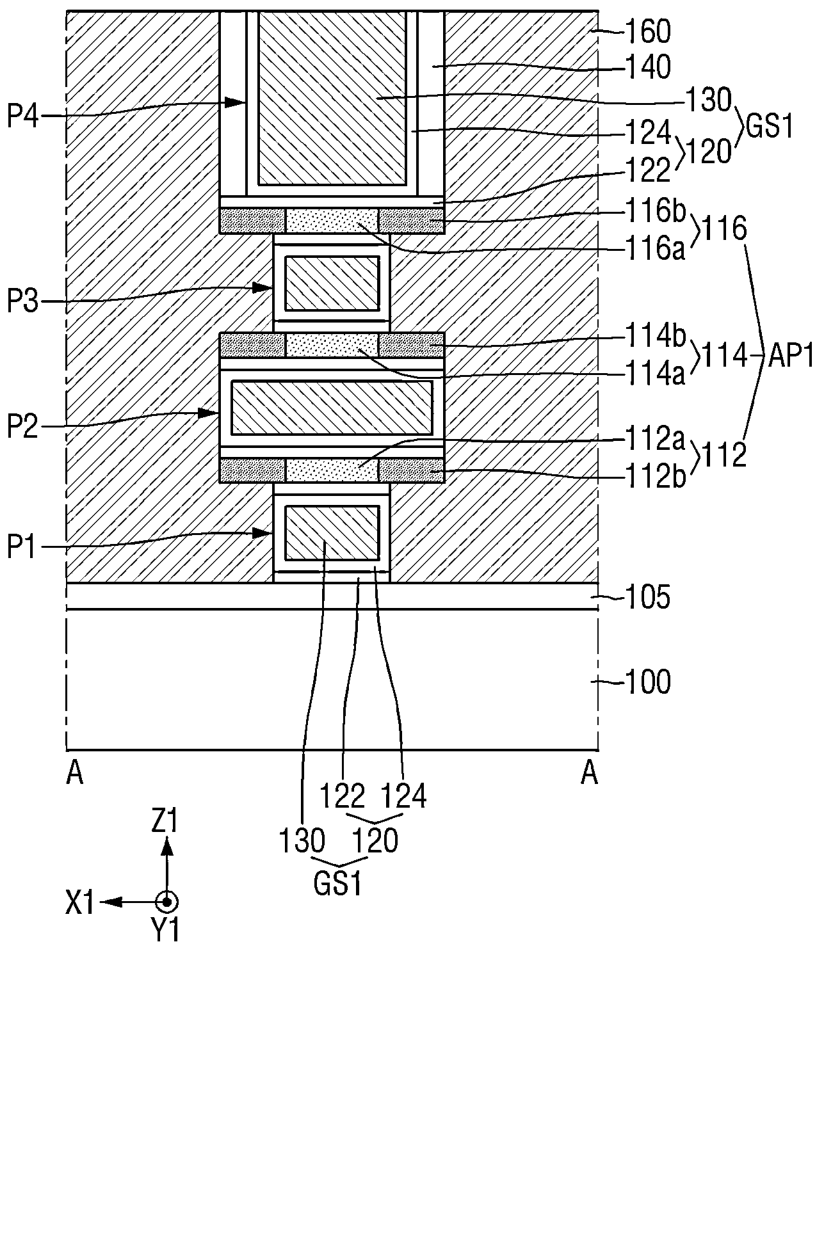

FIGS. 9 to 11 are cross-sectional views of semiconductor devices according to example embodiments of the present disclosure. For convenience, the embodiments of FIGS. 9 to 11 will hereinafter be described, focusing mainly on the differences with the embodiment of FIGS. 1 to 6.

Referring to FIG. 9, each of first source/drain contacts 160 may include a contact insertion film 162 and a contact filling film 164.

The contact insertion film 162 may surround end portions of each of channel layers 112, 114, and 116. For example, the contact insertion film 162 may extend along the outer surfaces of first gate spacers 140, first inner spacers 145, and a first gate dielectric film 120 and along first contact portions 112*b*, 114*b*, and 116*b* of the channel layers 112, 114, and 116. In some embodiments, the contact insertion film 162 may contact the outer surfaces of first gate spacers 140, first inner spacers 145, the first gate dielectric film 120, and the first contact portions 112*b*, 114*b*, and 116*b* of the channel layers 112, 114, and 116. The contact insertion film 162 may extend further along the upper surface of a first separation insulating film 105. For example, the contact insertion film 162 may contact the upper surface of the first separation insulating film 105.

The contact insertion film 162 may form ohmic contacts by being in contact with the end portions of each of the channel layers 112, 114, and 116. For example, in a case where a first active pattern AP1 includes a 2D semiconductor material that can be used as the channel regions of an NFET, the work function of the contact insertion film 162 may be less than the work function of the 2D semiconductor material. Alternatively, in a case where the first active pattern AP1 includes a 2D semiconductor material that can be used as the channel regions of a PFET, the work function of the contact insertion film 162 may be greater than the work function of the 2D semiconductor material. In this manner, the contact resistance between the first active pattern AP1 and the first source/drain contacts 160 can be further reduced.

The contact insertion film 162, which forms ohmic junctions with the channel layers 112, 114, and 116, may include a semimetal material. The semimetal material may be an allotrope of carbon (C) such as, for example, arsenic (As), antimony (Sb), bismuth (Bi), tin (Sn), indium (In), ruthenium (Ru) or graphite, but the present disclosure is not limited thereto.

The contact filling film 164 may be stacked on the contact insertion film 162. The contact filling film 164 may contact the contact insertion film 162. The contact filling film 164 may fill the spaces of the first source/drain contacts 160 that remain empty after the formation of the contact insertion film 162. The contact filling film 164 may include a metal material such as, for example, Ni, Pd, Au, Ti, Ag, Al, W, or Cu, Mn, or Zr, but the present disclosure is not limited thereto.

Referring to FIG. 10, the semiconductor device according to example embodiments of the present disclosure may further include second inner spacers 147.

The second inner spacers 147 may be formed on the side surfaces of part of a first gate structure GS1 having a relatively large gate length. For example, the second inner spacers 147 may be formed on the side surfaces of the second gate portion P2.

The second inner spacers 147 may include an insulating material such as at least one of, for example, silicon nitride, silicon oxynitride, silicon oxycarbide, silicon boron nitride, silicon carbonitride, silicon oxycarbonitride, and a combination thereof, but the present disclosure is not limited thereto.

In some embodiments, the second inner spacers 147 may be formed on the same level as the first inner spacers 145, which means that the first inner spacers 145 and the second inner spacers 147 may be formed by the same manufacturing process.

In some embodiments, a thickness Ts3 in the first direction X1 of the second inner spacers 147 may be less than a thickness Ts1 in the first direction X1 of the first inner spacers 145 because the side surfaces of part of the first gate structure GS1 where the second inner spacers 147 are formed (e.g., the side surfaces of a second gate portion P2) protrude beyond the side surfaces of part of the first gate structure GS1 where the first inner spacers 145 are formed (e.g., the side surfaces of a first or third gate portion P1 or P3).

Referring to FIG. 11, the side surfaces of each of first, second, and third gate portions P1, P2, and P3 may be in contact with first source/drain contacts 160.

For example, in some embodiments, the first inner spacers 145 and the second inner spacers 147 of FIG. 10 may not be provided. In this case, the area of top contacts formed by channel layers 112, 114, and 116 and the first source/drain contacts 160 may further increase.

Figure 12:
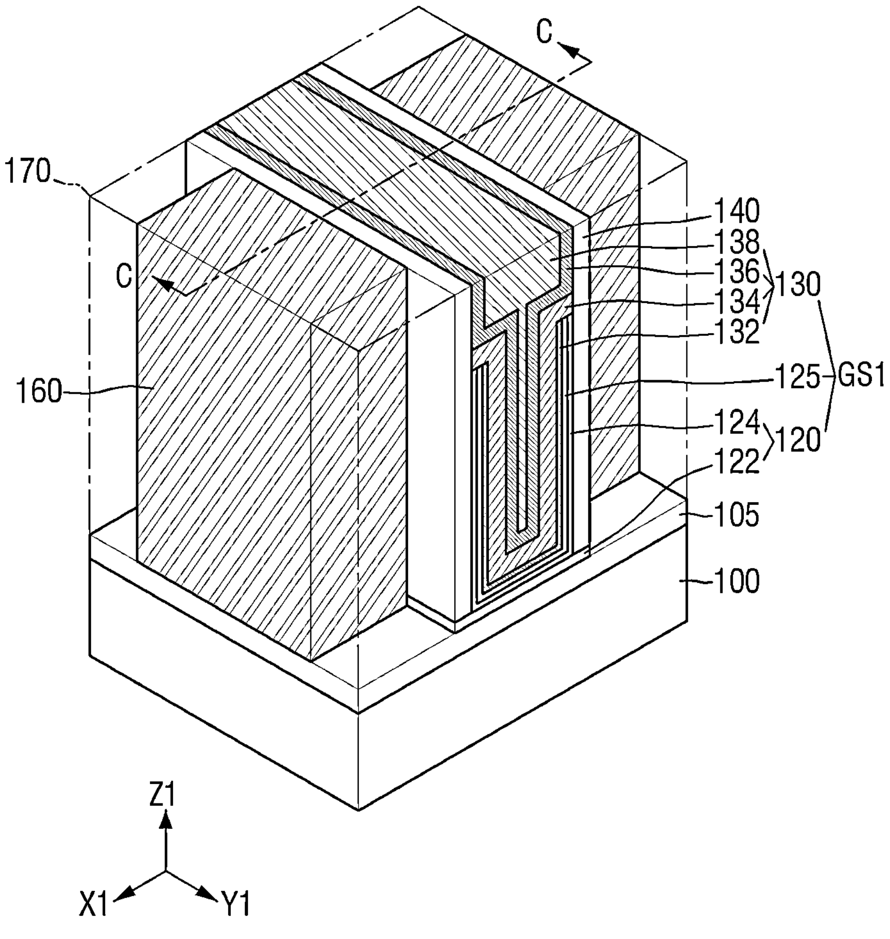
FIG. 12 is a perspective view of a semiconductor device according to example embodiments of the present disclosure.
Figure 13:
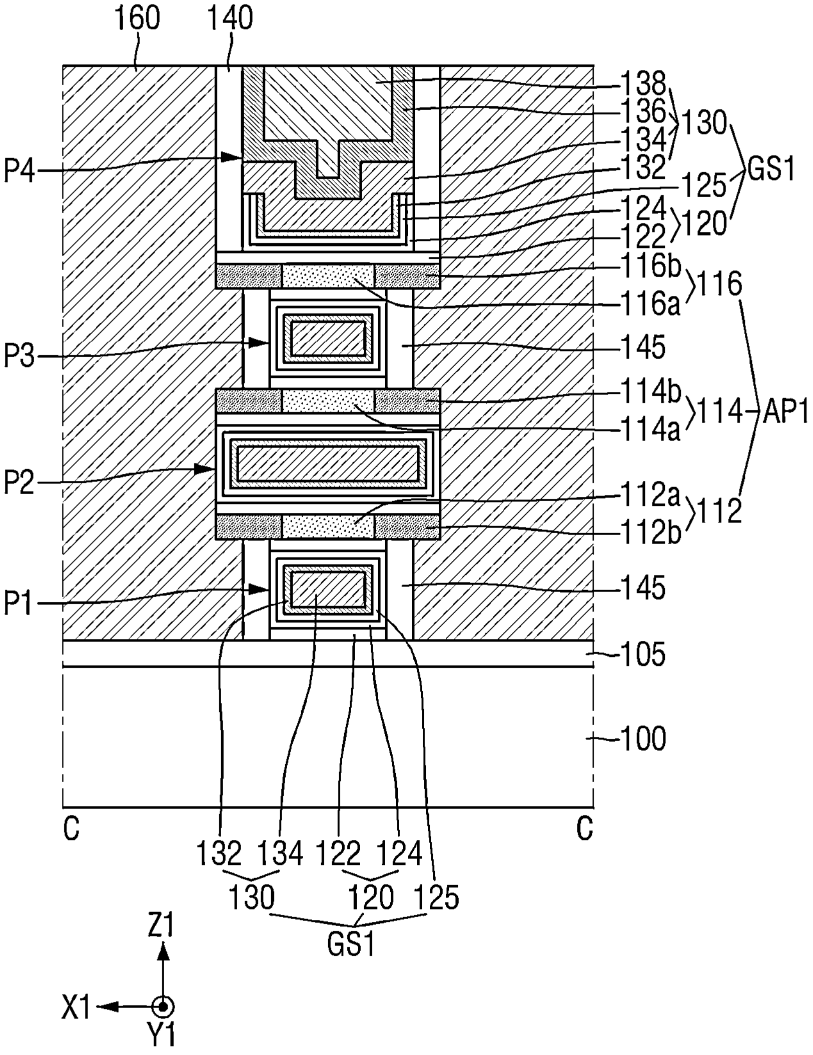
FIG. 13 is a cross-sectional view taken along line C-C of FIG. 12.

FIG. 12 is a perspective view of a semiconductor device according to example embodiments of the present disclosure. FIG. 13 is a cross-sectional view taken along line C-C of FIG. 12. For convenience, the embodiment of FIGS. 12 and 13 will hereinafter be described, focusing mainly on the differences with the embodiment of FIGS. 1 to 6.

Referring to FIGS. 12 and 13, a first gate electrode 130 may include a first work function conductive film 132, a second work function conductive film 134, a first barrier film 136, and a first filling conductive film 138.

The first and second work function conductive films 132 and 134 may include a conductive material capable of controlling the work function of a first gate structure GS1, such as at least one of, for example, TiN, TaN, TiC, TaC, TiAl, TiAIC, TION, and a combination thereof. The first and second work function conductive films 132 and 134 may include different conductive materials. For example, the first work function conductive film 132 may include a TiN film, and the second work function conductive film 134 may include a TiAl film.

The first barrier film 136 may include a conductive material capable of preventing the diffusion of an element included in the first filling conductive film 138, such as, for example, a metal nitride (e.g., TiN).

The first filling conductive film 138 may fill the space formed by the first work function conductive film 132, the second work function conductive film 134, and the first barrier film 136. The first filling conductive film 138 may include a film of a metal such as, for example, W or Al, but the present disclosure is not limited thereto.

In some embodiments, a first work function insulating film 125 may be interposed between a first gate dielectric film 120 and the first gate electrode 130. The first work function insulating film 125 may include an insulating material capable of controlling the work function of the first gate electrode GS1, such as a metal oxide (e.g., AlO or LaO).

In some embodiments, the tops of a second sub-dielectric film 124, the first work function insulating film 125, and the first work function conductive film 132 may be recessed. The second work function conductive film 134, the first barrier film 136, and the first filling conductive film 138 may be formed to fill recessed parts of the second sub-dielectric film 124, the first work function insulating film 125, and the first work function conductive film 132.

Figure 14:
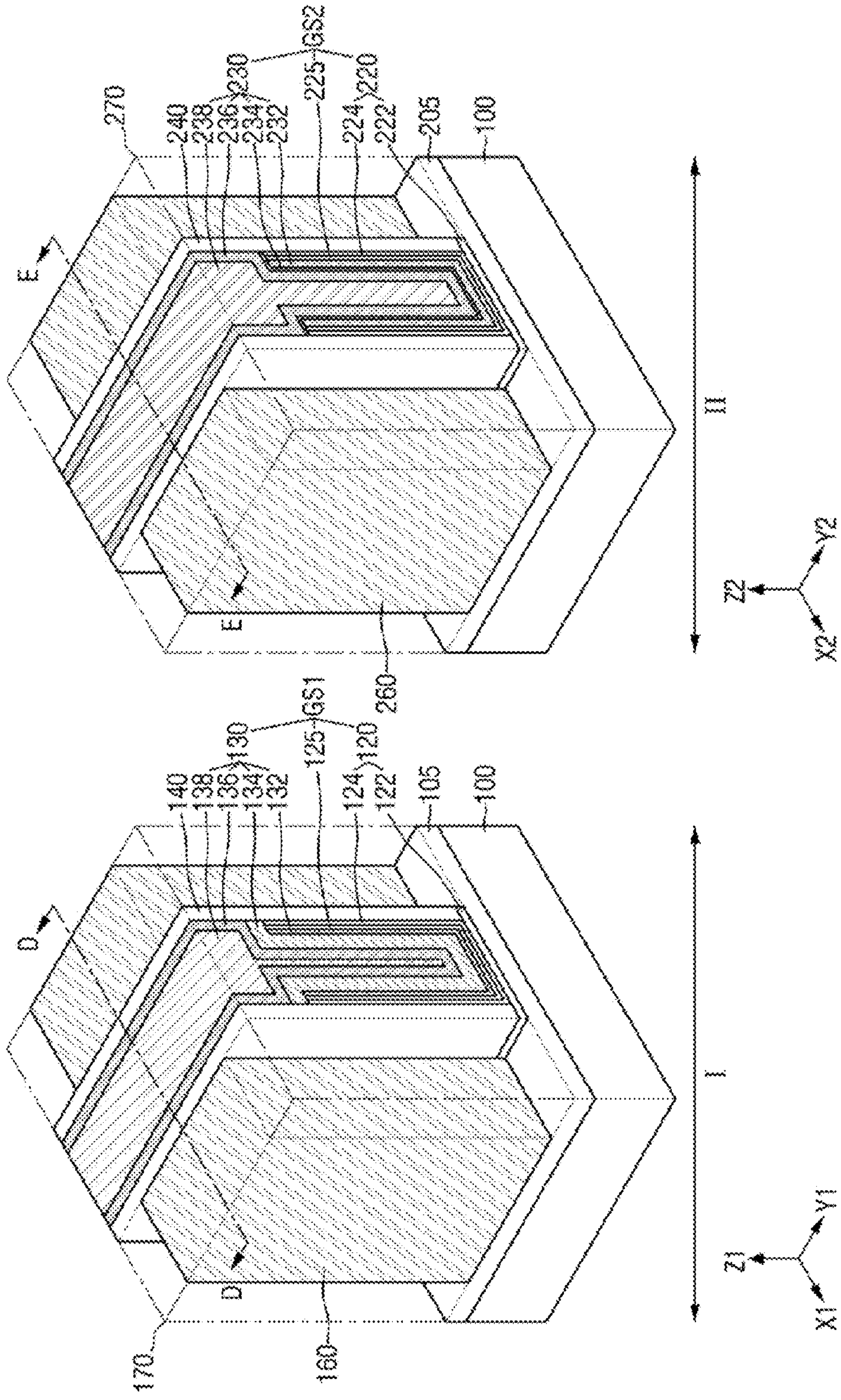
FIG. 14 is a perspective view of a semiconductor device according to example embodiments of the present disclosure.
Figure 15:
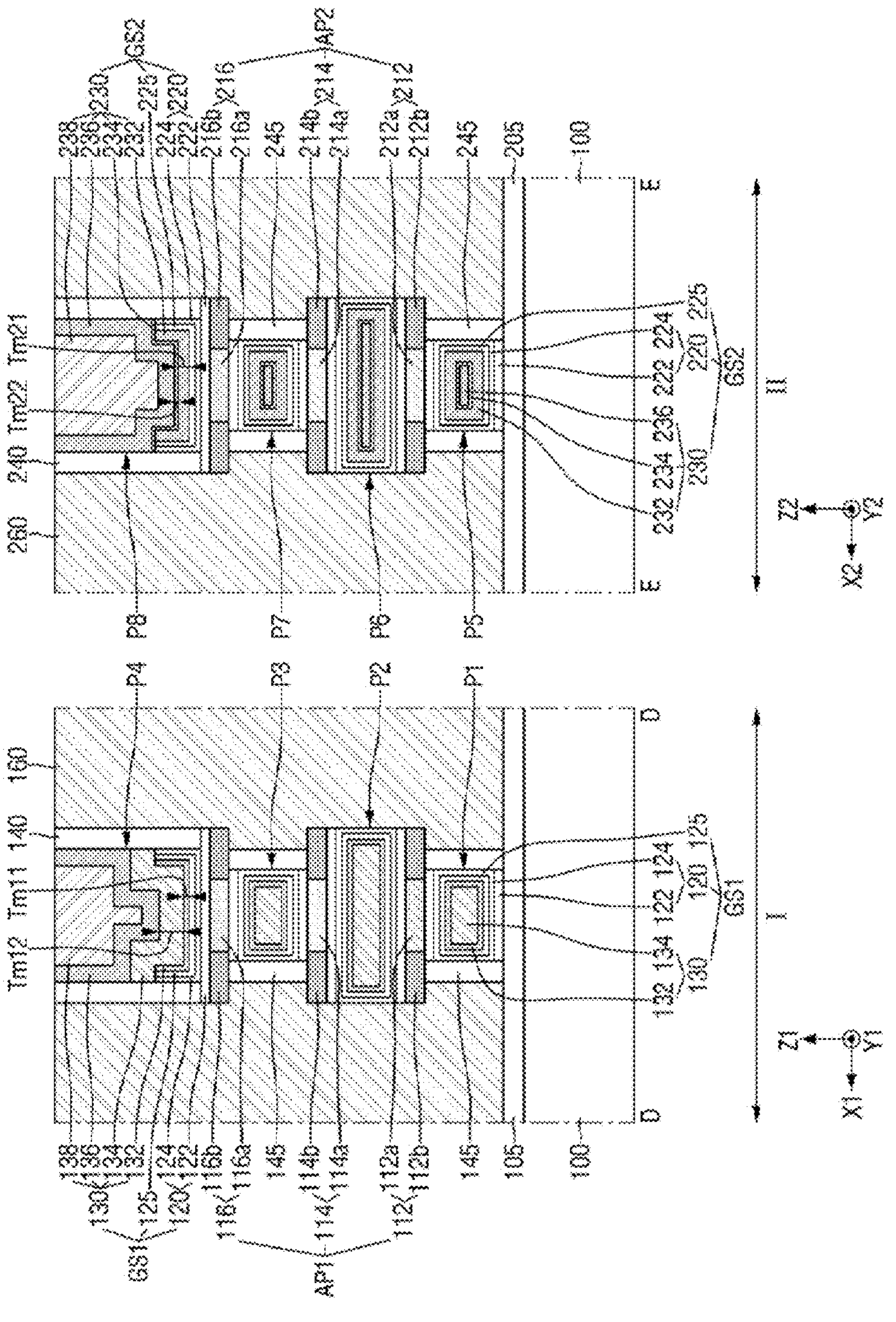
FIG. 15 is a cross-sectional view taken along lines D-D and E-E of FIG. 14.

FIG. 14 is a perspective view of a semiconductor device according to example embodiments of the present disclosure. FIG. 15 is a cross-sectional view taken along lines D-D and E-E of FIG. 14. For convenience, the embodiment of FIGS. 14 and 15 will hereinafter be described, focusing mainly on the differences with the embodiments of FIGS. 1 to 13.

Referring to FIGS. 14 and 15, a substrate 100 includes first and second regions I and II.

The first and second regions I and II may be regions that are connected to each other or may be regions that are spaced apart from each other. Semiconductor devices of different conductivity types may be formed in the first and second regions I and II. The first region I will hereinafter be described as being an NFET region, and the second region II will hereinafter be described as being a PFET region.

The semiconductor device (hereinafter, the first transistor) in the first region I may include a first separation insulating film 105, a first active pattern AP1, a first gate structure GS1, first gate spacers 140, first source/drain contacts 160, and a first interlayer insulating film 170.

The semiconductor device (hereinafter, the second transistor) in the second region II may include a second separation insulating film 205, a second active pattern AP2, a second gate structure GS2, second gate spacers 240, second source/drain contacts 260, and a second interlayer insulating film 270. The second separation insulating film 205, the second active pattern AP2, the second gate structure GS2, the second gate spacers 240, the second source/drain contacts 260, and the second interlayer insulating film 270 are substantially the same as the first separation insulating film 105, the first active pattern AP1, the first gate structure GS1, the first gate spacers 140, the first source/drain contacts 160, and the first interlayer insulating film 170, respectively, except that they are formed in the second region II, and thus, detailed descriptions thereof will be omitted.

In some embodiments, the first and second active patterns AP1 and AP2 may include different 2D semiconductor materials. For example, if the first and second transistors are an NFET and a PFET, respectively, the first active pattern AP1 may include $MoS_2$ or $MoSe_2$, and the second active pattern AP2 may include $WS_2$ or $WSe_2$. In other embodiments, the first and second active patterns AP1 and AP2 may include the same 2D semiconductor material.

The second active pattern AP2 may include a plurality of channel layers (e.g., channel layers 212, 214, and 216), which are sequentially disposed on the second separation insulating film 205 and are spaced apart from one another. In some embodiments, the channel layers 212, 214, and 216 may include second central portions 212*a*, 214*a*, and 216*a* and second contact portions 212*b*, 214*b*, and 216*b*. In a case where the first and second transistors are an NFET and a PFET, respectively, first contact portions 112*b*, 114*b*, and 116*b* may include a 2D semiconductor material doped with n-type impurities, and the second contact portions 212*b*, 214*b*, and 216*b* may include a 2D semiconductor material doped with p-type impurities.

The second gate structure GS2 may include a second gate dielectric film 220 and a second gate electrode 230. The second gate structure GS2 may include a plurality of gate portions P5 to P8, which are alternately arranged with the channel layers 212, 214, and 216 of the second active pattern AP2. The gate portions (e.g., gate portions P5 to P8) of the second gate structure GS2 may have alternating gate lengths in a third direction Z1 with respect to the channel layers 212, 214, and 216 of the second active pattern AP2.

In some embodiments, the second gate dielectric film 220 may include third and fourth sub-dielectric films 222 and 224, which are sequentially stacked. The third and fourth sub-dielectric films 222 and 224 of the second gate dielectric film 220 may be substantially the same as the first and second sub-dielectric films 122 and 124 of the first gate dielectric film 120. In some embodiments, the second gate electrode 230 may include a third work function conductive film 232, a fourth work function conductive film 234, a second barrier film 236, and a second filling conductive film 238, which are sequentially stacked. In some embodiments, a second work function insulating film 225 may be interposed between the second gate dielectric film 220 and the second gate electrode 230. The third work function conductive film 232, the fourth work function conductive film 234, the second barrier film 236, the second filling conductive film 238, and the second work function insulating film 225 may be substantially the same as the first work function conductive film 132, the second work function conductive film 134, the first barrier film 136, the first filling conductive film 138, and the first work function insulating film 125, respectively.

In a case where the first and second transistors are an NFET and a PFET, respectively, a thickness Tm11 in the third direction Z1 of the first work function conductive film 132 may be less than a thickness Tm21 in the third direction Z2 of the third work function conductive film 232, and a thickness Tm12 in the third direction Z1 of the second work function conductive film 134 may be greater than a thickness Tm22 in the third direction Z2 of the fourth work function conductive film 234. In the second region II, the first direction X2, the second direction Y2, and the third direction Z2 may be perpendicular to each other. The first direction X2 and the second direction Y2 may be parallel to a top surface of the substrate 100, and the third direction Z2 may be perpendicular to the top surface of the substrate 100. In some embodiments, the third direction Z1 of the first region I and the third direction Z2 of the second region II may be substantially the same direction. In some embodiments, the first and second directions X1 and Y1 of the first region I may be substantially the same direction as the first and second directions X2 and Y2 of the second region II. In other embodiments, the first and second directions X1 and Y1 of the first region I may be different directions than the first and second directions X2 and Y2 of the second region II.

Figure 16:
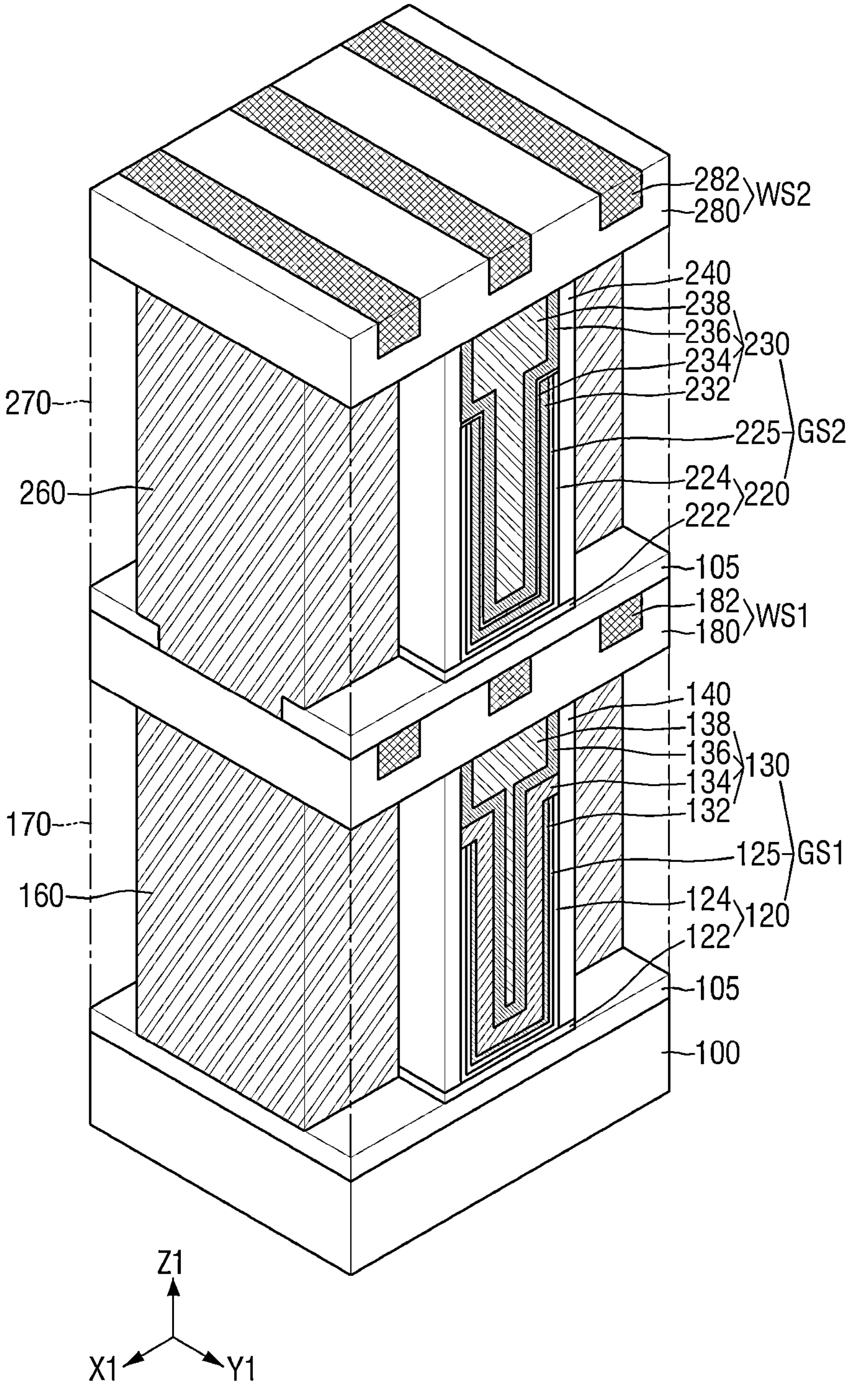
FIG. 16 is a perspective view of a semiconductor device according to example embodiments of the present disclosure.
Figure 17:
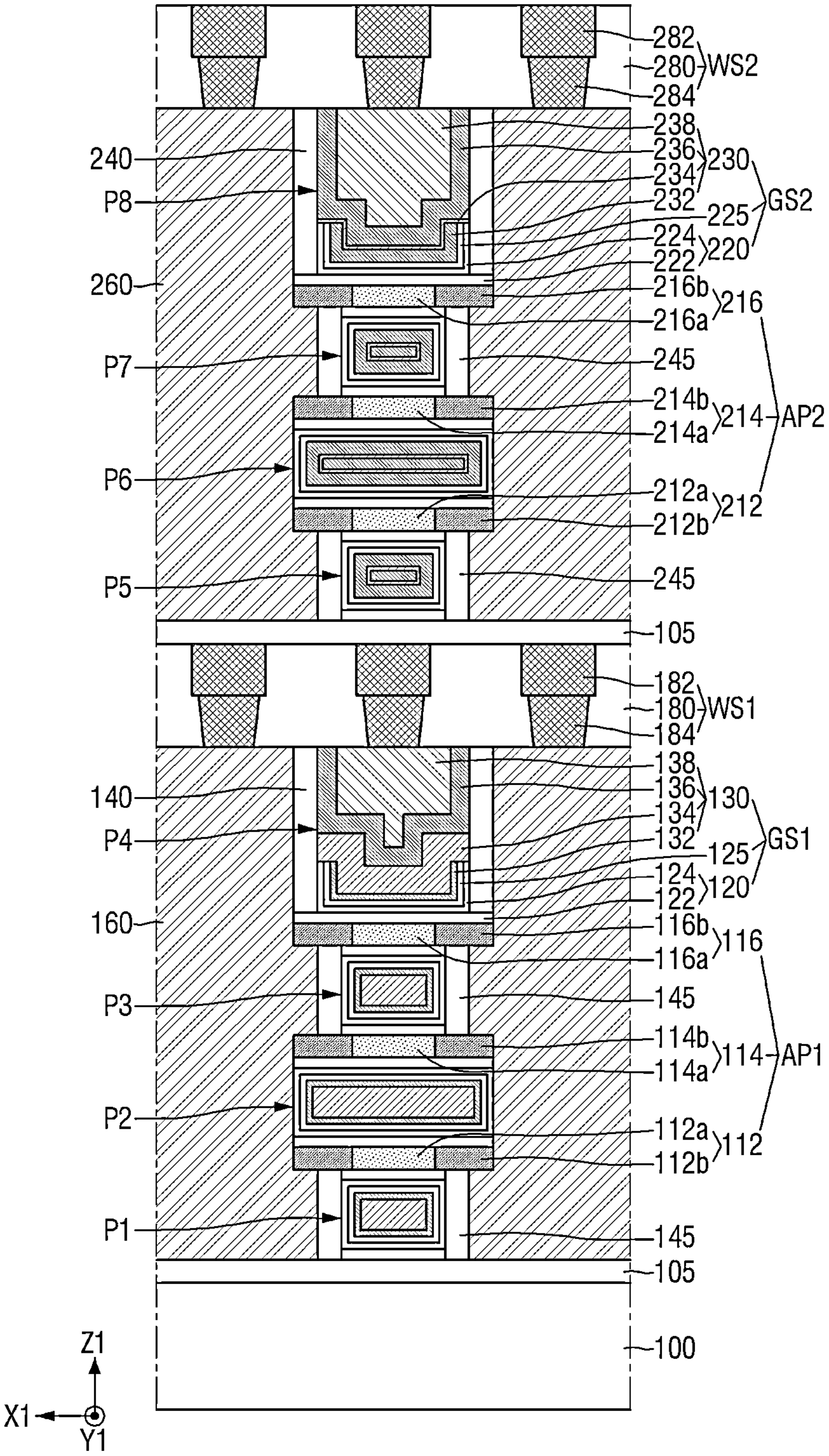
FIG. 17 is a cross-sectional view taken along line F-F of FIG. 16.

FIG. 16 is a perspective view of a semiconductor device according to example embodiments of the present disclosure. FIG. 17 is a cross-sectional view taken along line F-F of FIG. 16. For convenience, the embodiment of FIGS. 16 and 17 will hereinafter be described, focusing mainly on the differences with the embodiments of FIGS. 1 to 15.

Referring to FIGS. 16 and 17, a semiconductor device (hereinafter, the second transistor) including a second active pattern AP2 and a second gate electrode 230 may be stacked on a semiconductor device (hereinafter, the first transistor) including a first active pattern AP1 and a first gate electrode 130.

For example, a first wiring structure WS1 may be formed on the first transistor. The second transistor may be stacked on the first wiring structure WS1. The first wiring structure WS1 may be electrically connected to the first gate electrode 130 and/or the first source/drain contacts 160. For example, the first wiring structure WS1 may include a first inter-wiring insulating film 180 and first wiring patterns 182, which extend in a second direction Y1 in the first inter-wiring insulating film 180. The first wiring patterns 182 may be electrically connected to the first gate electrode 130 and/or the first source/drain contacts 160 via first via patterns 184, which extend in a third direction Z1 in the first inter-wiring insulating film 180.

For example, a second wiring structure WS2 may be formed on the second transistor. The second wiring structure WS2 may be electrically connected to the second gate electrode 230 and/or the second source/drain contacts 260. For example, the second wiring structure WS2 may include a second inter-wiring insulating film 280 and second wiring patterns 282, which extend in the second direction Y1 in the second inter-wiring insulating film 280. The second wiring patterns 282 may be electrically connected to the second gate electrode 230 and/or the second source/drain contacts 260 via second via patterns 284, which extend in the third direction Z1 in the second inter-wiring insulating film 280.

However, the present disclosure is not limited to these examples. That is, in some embodiments, the first and second wiring structures WS1 and WS2 may be connected in various other manners.

In some embodiments, the first and second transistors may be electrically connected. For example, the first and second transistors may form a complementary metal-oxide semiconductor (CMOS). For example, the first and second transistors may form an inverter connected in parallel between a power supply node VDD and a ground node VSS. The input of the inverter may be connected in common to the first and second gate electrodes 130 and 230, and the output of the inverter may be connected in common to the drain of the first transistor (e.g., a first source/drain contact 160 on one side of the first gate electrode 130) and the drain of the second transistor (e.g., a second source/drain contact 260 on one side of the second gate electrode 230).

In some embodiments, the second source/drain contacts 260 may be electrically connected to the first wiring structure WS1 through a second separation insulating film 205. For example, the second separation insulating film 205 may expose part of the upper surface of the first wiring structure WS1. Lower parts of the second source/drain contacts 260 may be connected to parts of the first wiring patterns 182 exposed by the second separation insulating film 205. In this manner, the first and second transistors may be electrically connected. For example, the first wiring structure WS1 may electrically connect the first source/drain contacts 160 and the second source/drain contacts 260.

Methods of fabricating a semiconductor device according to example embodiments of the present disclosure will hereinafter be described with reference to FIGS. 1 to 34.

FIGS. 18 to 30 are perspective or cross-sectional views illustrating intermediate steps of a method of fabricating a semiconductor device according to example embodiments of the present disclosure. For convenience, the embodiment of FIGS. 18 to 30 will hereinafter be described, focusing mainly on the differences with the embodiments of FIGS. 1 to 17.

Figure 18:
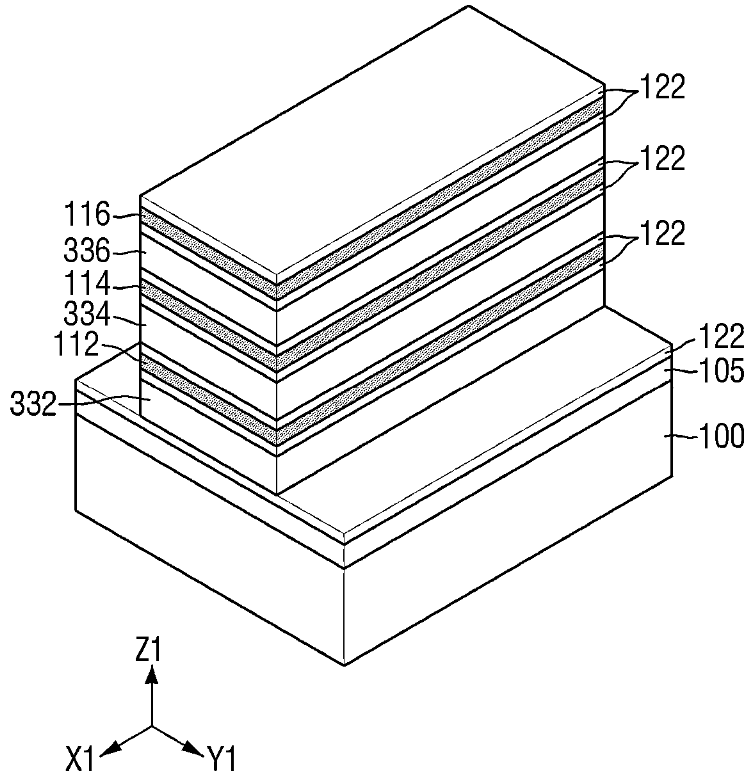
FIGS. 18 to 30 are perspective or cross-sectional views illustrating intermediate steps of a method of fabricating a semiconductor device according to example embodiments of the present disclosure.

Referring to FIG. 18, a first separation insulating film 105, a plurality of channel layers 112, 114, and 116, a plurality of sacrificial layers 332, 334, and 336, and a first sub-dielectric film 122 are formed on a substrate 100.

The first separation insulating film 105 may be formed on the substrate 100. The first separation insulating film 105 may cover at least part of the upper surface of the substrate 100.

The channel layers 112, 114, and 116 and the sacrificial layers 332, 334, and 336 may be alternately stacked on the substrate 100 and the first separation insulating film 105. For example, a first sacrificial layer 332 may be interposed between the first separation insulating film 105 and a first channel layer 112, a second sacrificial layer 334 may be interposed between the first channel layer 112 and a second channel layer 114, and a third sacrificial layer 336 may be interposed between the second channel layer 114 and a third channel layer 116.

The first sub-dielectric film 122 may be interposed between the channel layers 112, 114, and 116 and the sacrificial layers 332, 334, and 336. For example, the first sub-dielectric film 122 may be interposed between the first sacrificial layer 332 and the first channel layer 112, between the first channel layer 112 and the second sacrificial layer 334, between the second sacrificial layer 334 and the second channel layer 114, between the second channel layer 114 and the third sacrificial layer 336, and between the third sacrificial layer 336 and the second channel layer 114. The first sub-dielectric film 122 may extend along the upper surfaces of the first separation insulating film 105 and the third channel layer 116.

The channel layers 112, 114, and 116, the sacrificial layers 332, 334, and 336, and the first sub-dielectric film 122 may be patterned to extend in a first direction X1. The lowermost part of the first sub-dielectric film 122 is illustrated as not being patterned, but the present disclosure is not limited thereto. Alternatively, the lowermost part of the first sub-dielectric film 122 may also be patterned to extend in the first direction X1, in which case, the first separation insulating film 105 may be used as an etch stopper.

The sacrificial layers 332, 334, and 336 may include a material with an etch selectivity with respect to the channel layers 112, 114, and 116 and the first sub-dielectric film 122. For example, the sacrificial layers 332, 334, and 336 may include silicon-germanium (SiGe).

In some embodiments, the sacrificial layers 332, 334, and 336 may have alternating etch selectivities in a third direction Z1. For example, the first and third sacrificial layers 332 and 336 may have a different germanium (Ge) concentration from the second sacrificial layer 334. For example, the Ge concentrations of the first and third sacrificial layers 332 and 336 may be greater than the Ge concentration of the second sacrificial layer 334. In another example, the Ge concentrations of the first and third sacrificial layers 332 and 336 may be less than the Ge concentration of the second sacrificial layer 334.

Figure 19:
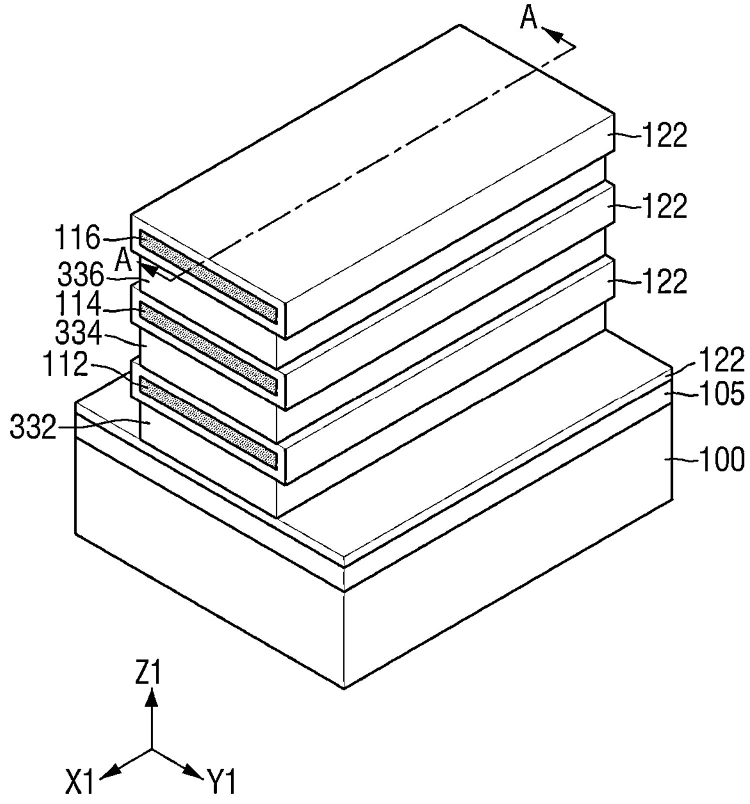
Figure 20:
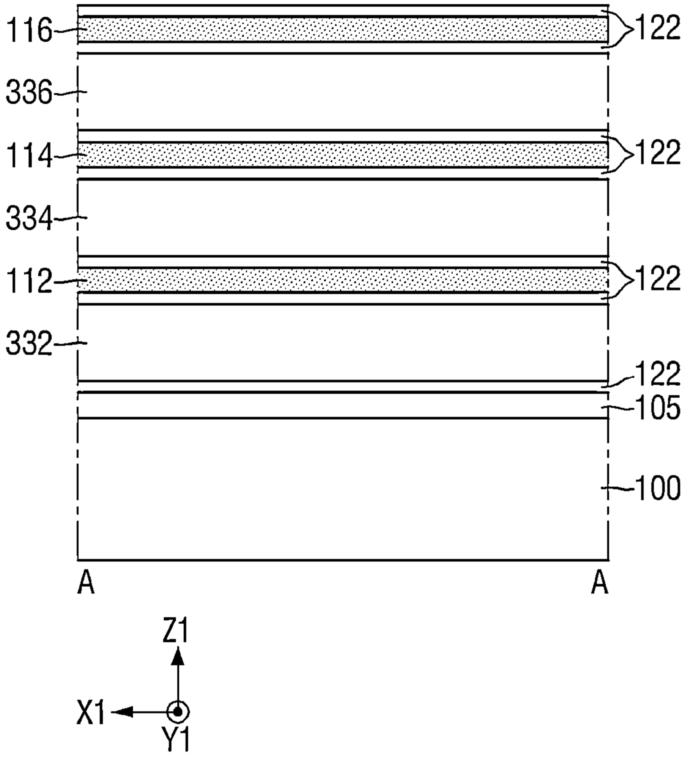

Referring to FIGS. 19 and 20, a selective deposition process is performed on the first sub-dielectric film 122. FIG. 20 is a cross-sectional view taken along line A-A of FIG. 19.

As the selective deposition process is performed, the first sub-dielectric film 122 may also be formed on the side surfaces of each of the channel layers 112, 114, and 116 that intersect the second direction Y1. As a result, the first sub-dielectric film 122 may surround the channels layers 112, 114, and 116. The first sub-dielectric film 122 may protect the channel layers 112, 114, and 116 in subsequent steps.

Figure 21:
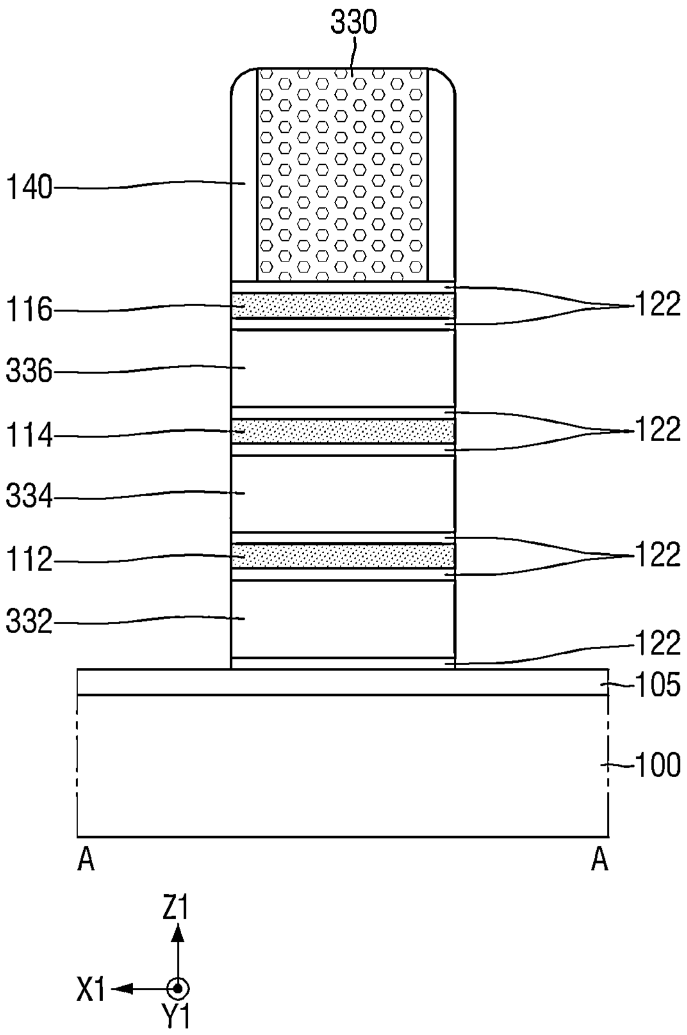

Referring to FIG. 21, a dummy gate 330 and first gate spacers 140 are formed.

The dummy gate 330 and the first gate spacers 140 may be formed on the substrate 100 and the first separation insulating film 105. The dummy gate 330 may intersect the channel layers 112, 114, and 116, the sacrificial layers 332, 334, and 336, and the first sub-dielectric film 122. For example, the dummy gate 330 may extend lengthwise in the second direction Y1, and may cross over the channel layers 112, 114, and 116, the sacrificial layers 332, 334, and 336, and the first sub-dielectric film 122. The first gate spacers 140 may extend along the side surfaces of the dummy gate 330.

Thereafter, an etching process may be performed using the dummy gate 330 and the first gate spacers 140 as an etch mask. As a result, the channel layers 112, 114, and 116, the sacrificial layers 332, 334, and 336, and the first sub-dielectric film 122 may be patterned.

The dummy gate 330 may include a material with an etch selectivity with respect to the channel layers 112, 114, and 116 and/or the first sub-dielectric film 122. For example, the dummy gate 330 may include polysilicon (poly Si).

Figure 22A:
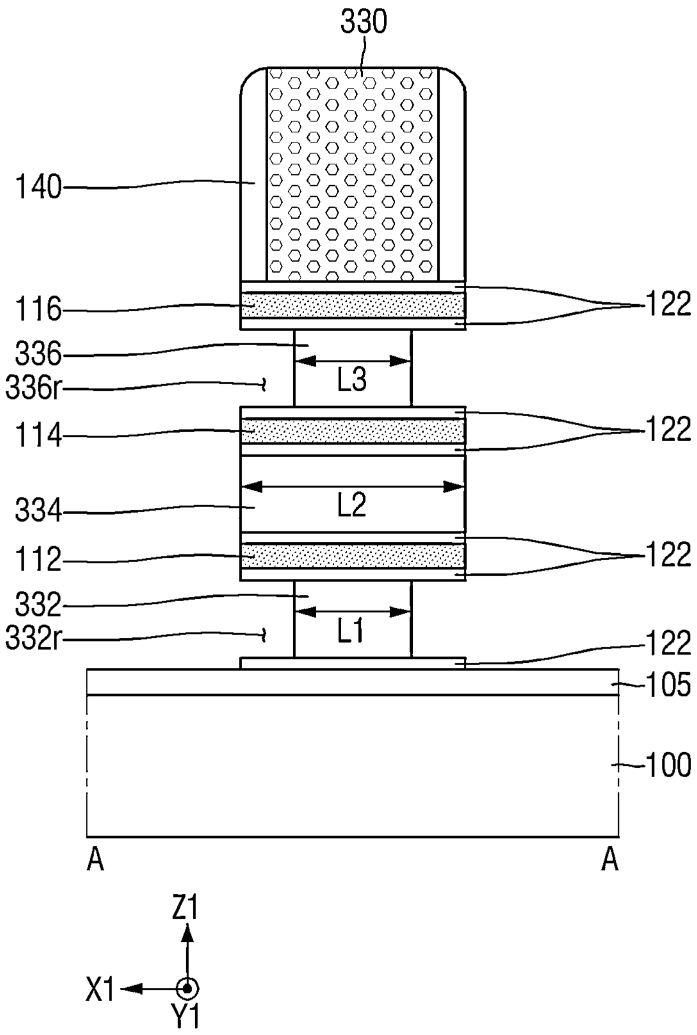
Figure 22B:
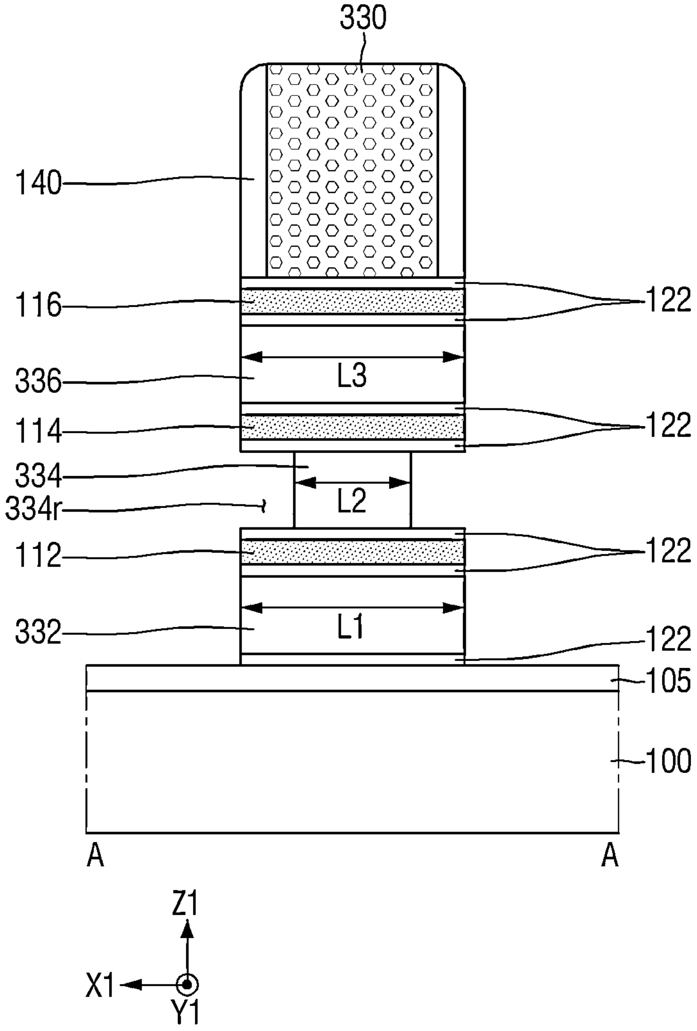

Referring to FIGS. 22A and 22B, a first recess process is performed on the sacrificial layers 332, 334, and 336.

As the first recess process is performed, at least parts of the sacrificial layers 332, 334, and 336 may be selectively recessed. Also, as the sacrificial layers 332, 334, and 336 have alternating etch selectivities in the third direction Z1, the sacrificial layers 332, 334, and 336 may have alternating lengths in the third direction Z1. Here, the lengths of the sacrificial layers 332, 334, and 336 refer to the lengths, in the first direction X1, of the sacrificial layers 332, 334, and 336.

For example, in a case where the Ge concentrations of the first and third sacrificial layers 332 and 336 are greater than the Ge concentration of the second sacrificial layer 334, the etching rates of the first and third sacrificial layers 332 and 336 may be greater than the etching rate of the second sacrificial layer 334 during the first recess process. As a result, as illustrated in FIG. 22A, a first length L1 in the first direction X1 of the first sacrificial layer 332 and a third length L3 in the first direction X1 of the third sacrificial layer 336 may be less than a second length L2 in the first direction X1 of the second sacrificial layer 334. FIG. 22A illustrates that only the first and third sacrificial layers 332 and 336 include recesses 332*r* and recesses 336*r*, respectively, and the second sacrificial layer 334 is not recessed, but the present disclosure is not limited thereto. Alternatively, the second sacrificial layer 334 may also include recesses from the first recess process.

In another example, in a case where the Ge concentrations of the first and third sacrificial layers 332 and 336 are less than the Ge concentration of the second sacrificial layer 334, the etching rates of the first and third sacrificial layers 332 and 336 may be less than the etching rate of the second sacrificial layer 334 during the first recess process. As a result, as illustrated in FIG. 22B, the first length L1 in the first direction X1 of the first sacrificial layer 332 and the third length L3 in the first direction X1 of the third sacrificial layer 336 may be greater than the second length L2 in the first direction X1 of the second sacrificial layer 334. FIG. 22B illustrates that only the second sacrificial layers 334 includes recesses 334*r* and the first and third sacrificial layers 332 and 336 are not recessed, but the present disclosure is not limited thereto. Alternatively, each of the first and third sacrificial layers 332 and 336 may also include recesses from the first recess process.

Steps to be performed after the step illustrated in FIG. 22A will hereinafter be described, and it is obvious that the same steps may also be performed after the step illustrated in FIG. 22B.

Figure 23:
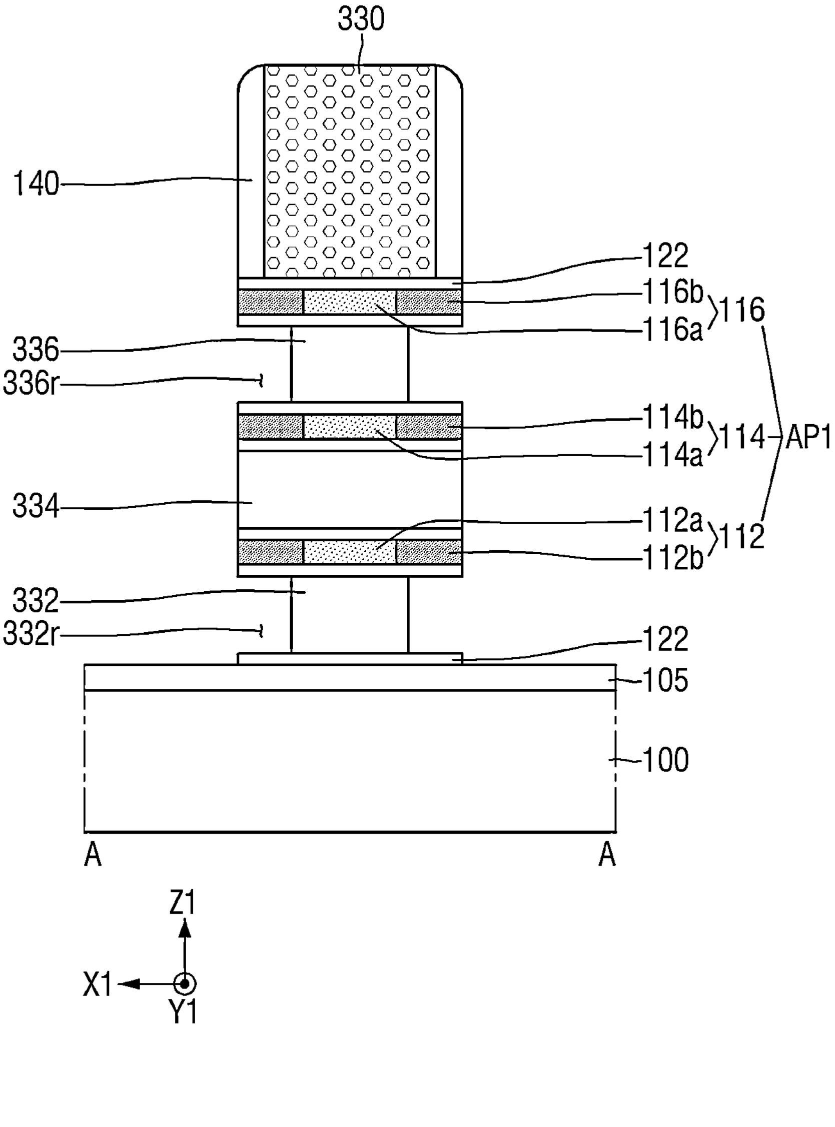

Referring to FIG. 23, a doping process is performed on the channel layers 112, 114, and 116.

As the doping process is performed, both end portions of each of the channel layers 112, 114, and 116 may be doped with impurities. For example, the channel layers 112, 114, and 116 may include first central portions 112*a*, 114*a*, and 116*a* and first contact portions 112*b*, 114*b*, and 116*b*. The first central portions 112*a*, 114*a*, and 116*b* may include a 2D semiconductor material. The first contact portions 112*b*, 114*b*, and 116*b* may include the 2D semiconductor material doped with impurities.

Figure 24:
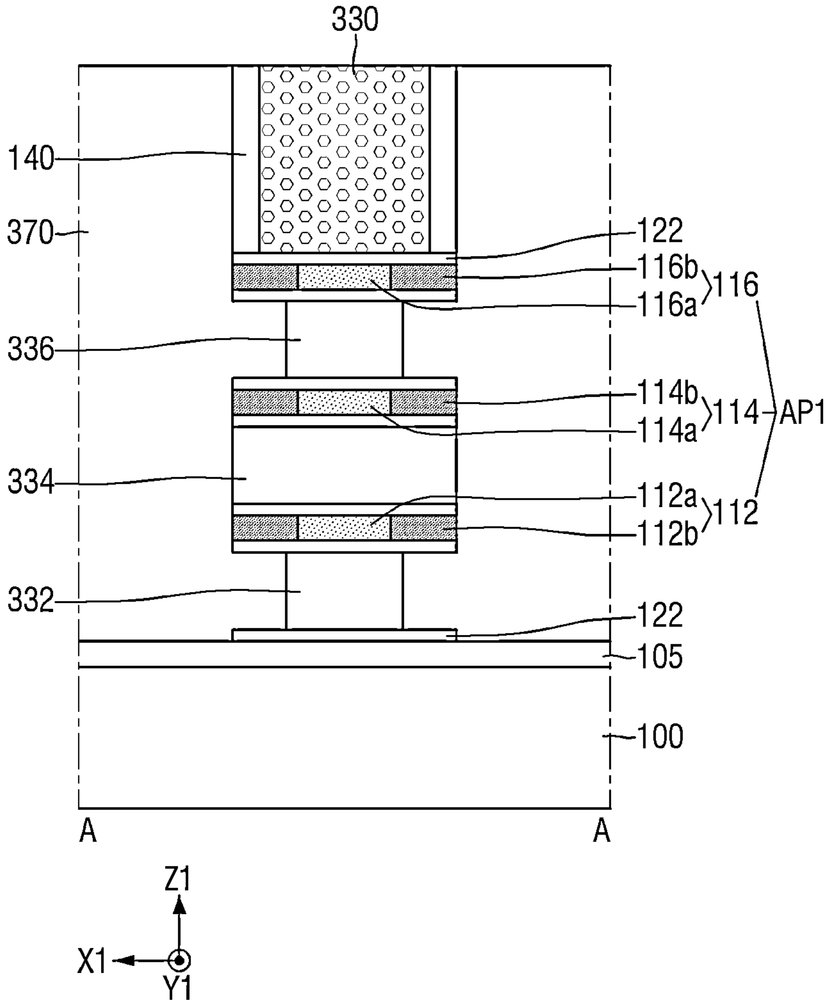

Referring to FIG. 24, a sacrificial gap-fill film 370 is formed on the substrate 100 and the first separation insulating film 105.

The sacrificial gap-fill film 370 may be formed to fill the space on the substrate 100 and the first separation insulating film 105. The sacrificial gap-fill film 370 may include a material with an etch selectivity with respect to the sacrificial layers 332, 334, and 336 and the dummy gate 330. For example, the sacrificial gap-fill film 370 may include silicon oxide.

Figure 25:
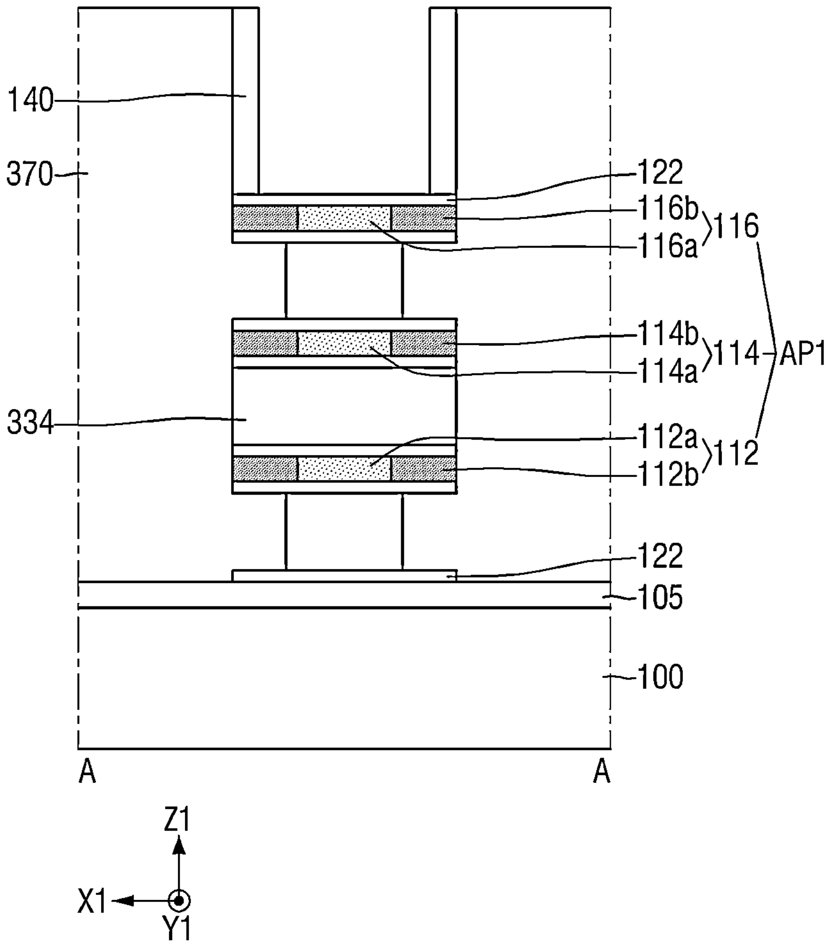

Referring to FIG. 25, the sacrificial layers 332, 334, and 336 and the dummy gate 330 are removed.

For example, the dummy gate 330, which is exposed by the sacrificial gap-fill film 370, may be removed. As the dummy gate 330 includes a material with an etch selectivity with respect to the first sub-dielectric film 122 and the sacrificial gap-fill film 370, the dummy gate 330 can be selectively removed. Thereafter, as the dummy gate 330 is removed, the sacrificial layers 332, 334, and 336 may be exposed and removed. As the sacrificial layers 332, 334, and 336 include a material with an etch selectivity with respect to the first sub-dielectric film 122 and the sacrificial gap-fill film 370, the sacrificial layers 332, 334, and 336 can be selectively removed.

Figure 26:
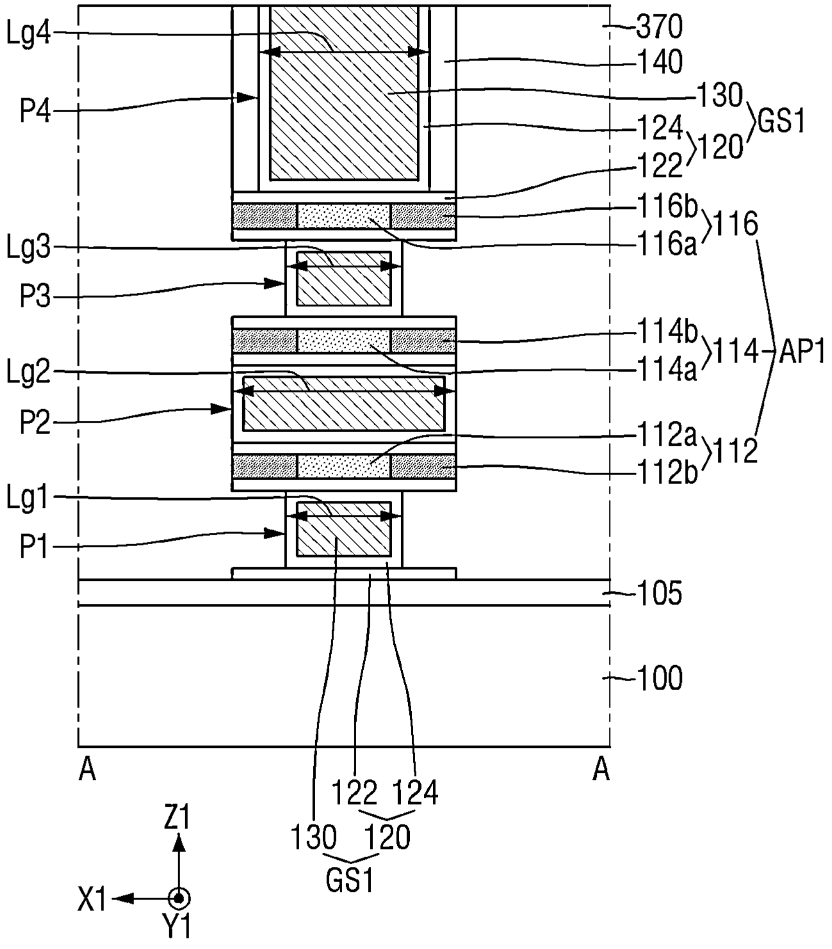

Referring to FIG. 26, a second sub-dielectric film 124 and a first gate electrode 130 are formed.

The second sub-dielectric film 124 may be stacked on the circumference of the first sub-dielectric film 122 and the inner surfaces of the first gate spacers 140. In this manner, a first gate dielectric film 120 including the first and second sub-dielectric films 122 and 124 may be formed. The first gate electrode 130 may be stacked on the second sub-dielectric film 124.

The second sub-dielectric film 124 and the first gate electrode 130 may replace the sacrificial layers 332, 334, and 336 and the dummy gate 330 of FIG. 24. In this manner, a first gate structure GS1, which extends in the second direction Y1, and a first active pattern AP1, which extends in the first direction X1 to penetrate the first gate structure GS1, may be formed.

The first gate structure GS1 may include a plurality of gate portions P1 through P4, which are alternately arranged with the channel layers 112, 114, and 116. The gate portions P1 to P4 may have alternating gate lengths in the third direction Z1 with respect to the channel layers 112, 114, and 116. For example, a first gate length Lg1 may be less than a second gate length Lg2, and the second gate length Lg2 may be greater than a third gate length Lg3. In some embodiments, the third gate length Lg3 may be less than a fourth gate length Lg4.

Figure 27:
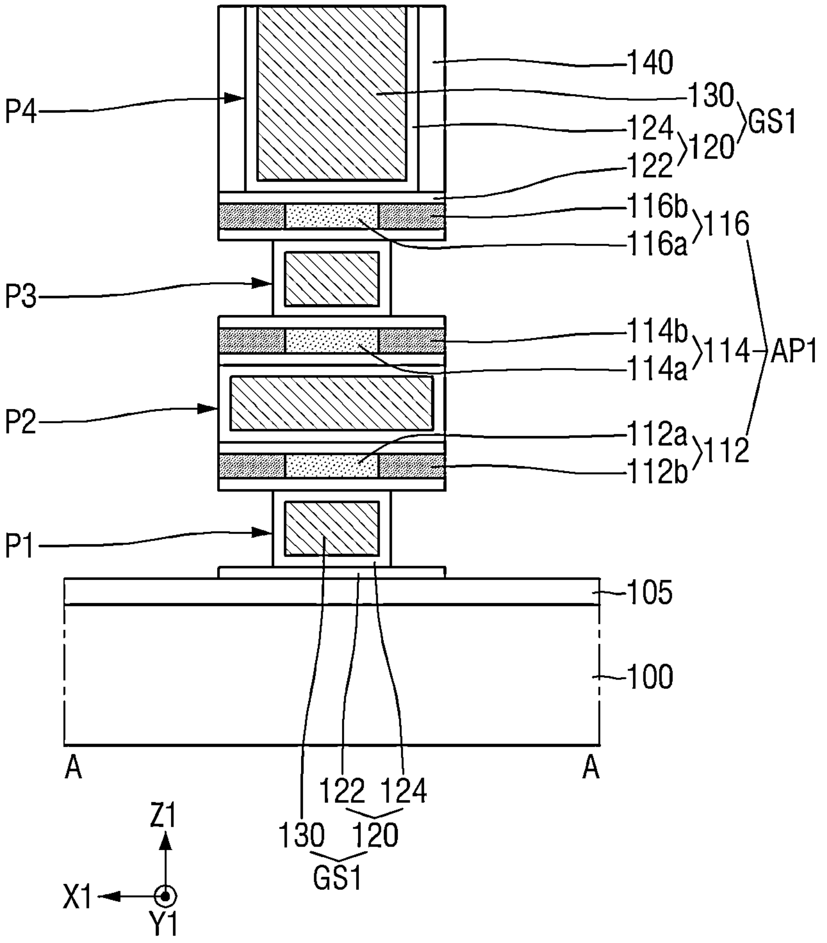

Referring to FIG. 27, the sacrificial gap-fill film 370 is removed.

As the sacrificial gap-fill film 370 is removed, the side surfaces of each of first, second, and third gate portions P1, P2, and P3 may be exposed.

Figure 28:
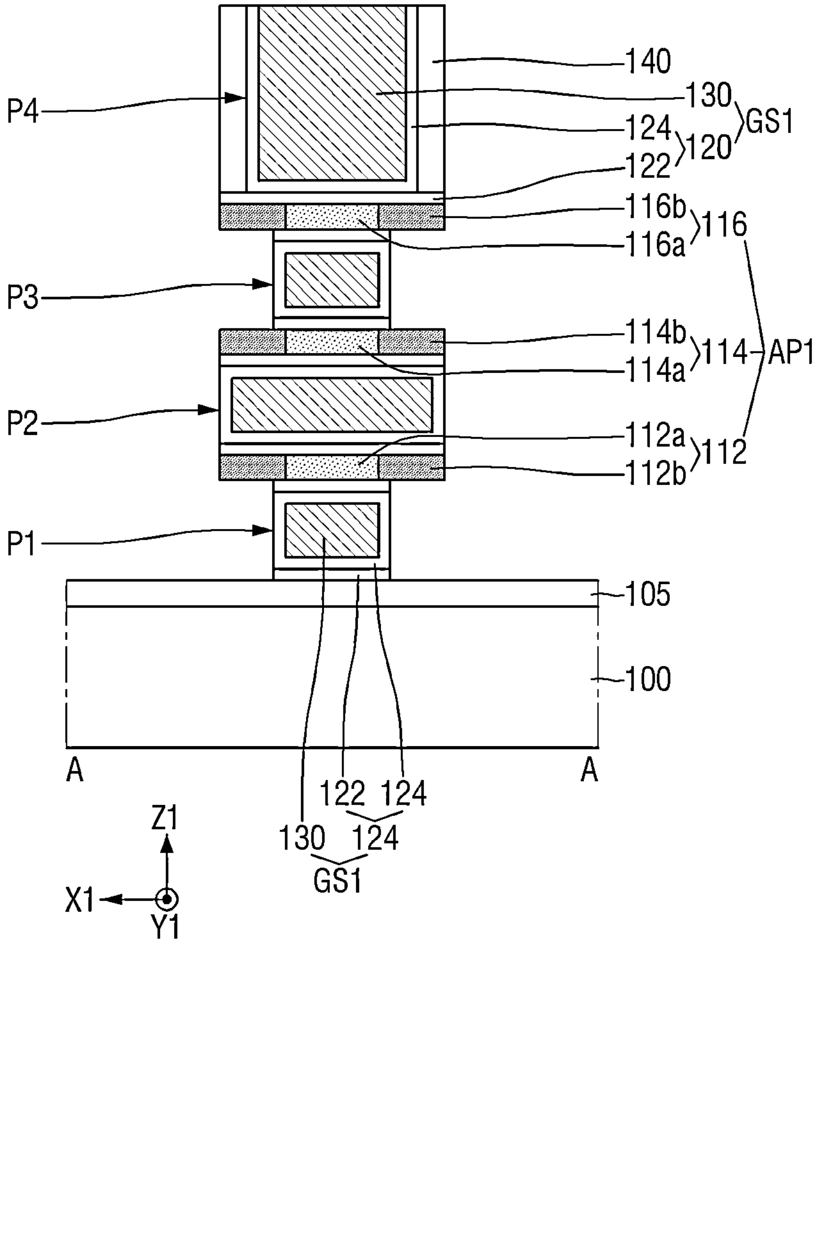

Referring to FIG. 28, a second recess process is performed on the first sub-dielectric film 122.

As the second recess process is performed, parts of the bottom or upper surface of each of the channel layers 112, 114, and 116 may be exposed by part of the first gate structure GS1 having a relatively small gate length. For example, parts of the first sub-dielectric film 122 adjacent to the first and third gate portions P1 and P3 may be recessed. Parts of the first sub-dielectric film 122 adjacent to the second gate portion P2 and a fourth gate portion P4 are illustrated as not being recessed, but the present disclosure is not limited thereto. Alternatively, the parts of the first sub-dielectric film 122 adjacent to the second and fourth gate portions P2 and P4 may also be recessed.

Figure 29:
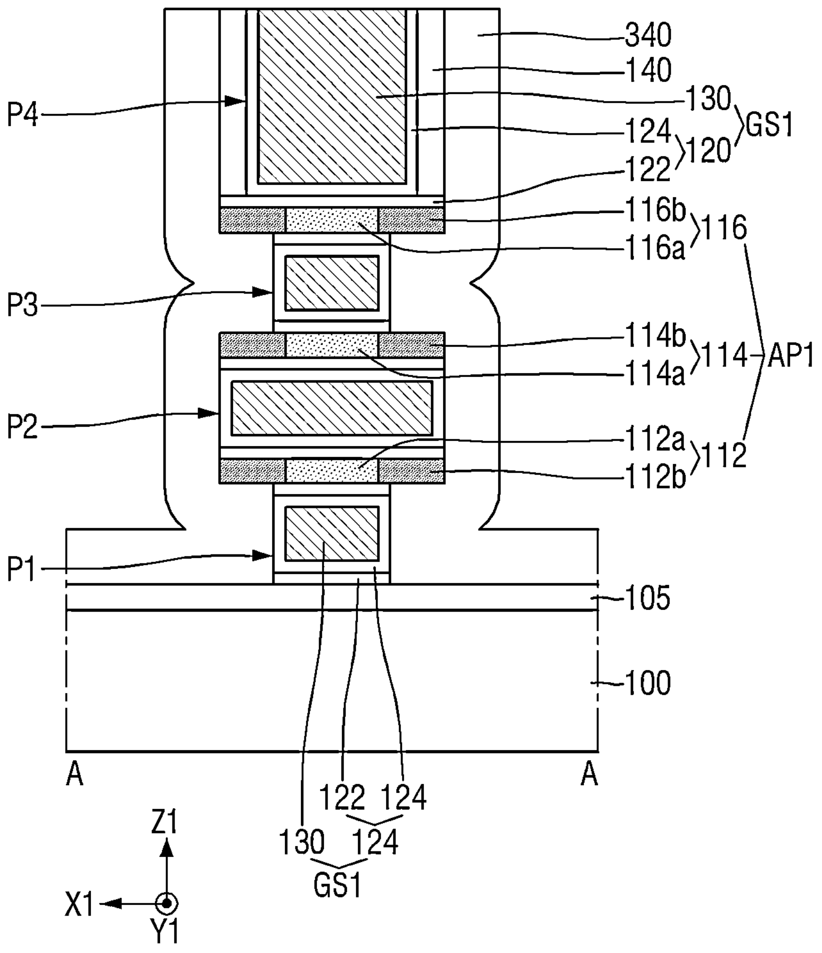

Referring to FIG. 29, a spacer film 340 is formed.

The spacer film 340 may extend along the side surfaces of each of the channel layers 112, 114, and 116, the side surfaces of the first sub-dielectric film 122, the side surfaces of the first gate structure GS1, and the side surfaces of the first gate spacers 140. The spacer film 340 may include an insulating material such as at least one of, for example, silicon nitride, silicon oxynitride, silicon oxycarbide, silicon boron nitride, silicon carbonitride, silicon oxycarbonitride, and a combination thereof, but the present disclosure is not limited thereto.

Figure 30:
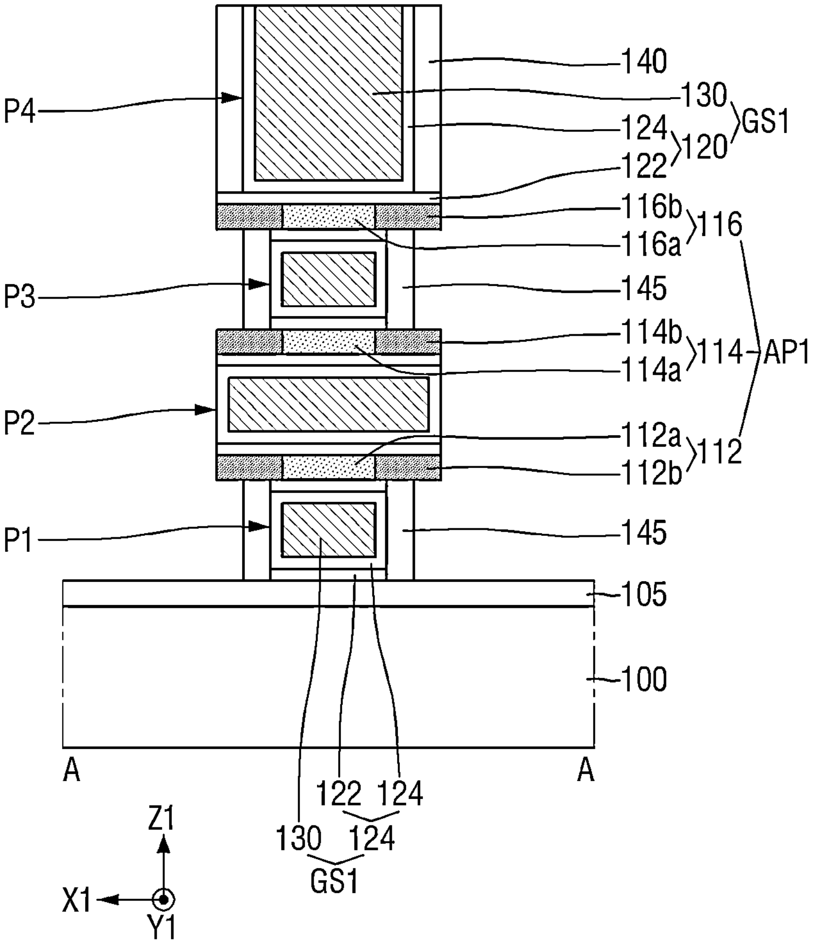

Referring to FIG. 30, a third recess process is performed on the spacer film 340.

As the third recess process is performed, first inner spacers 145 may be formed on the side surfaces of each part of the first gate structure GS1 having a relatively small gate length. For example, the first inner spacers 145 may be formed on the side surfaces of each of the first and third gate portions P1 and P3. In some embodiments, the spacer film 340 may be completely removed from the side surfaces of the second gate portion P2 so that the first inner spacers 145 may not be formed on the side surfaces of the second gate portion P2.

Thereafter, referring to FIG. 2, first source/drain contacts 160 are formed. In this manner, the semiconductor device of FIGS. 1 to 6 can be fabricated.

Figure 31:
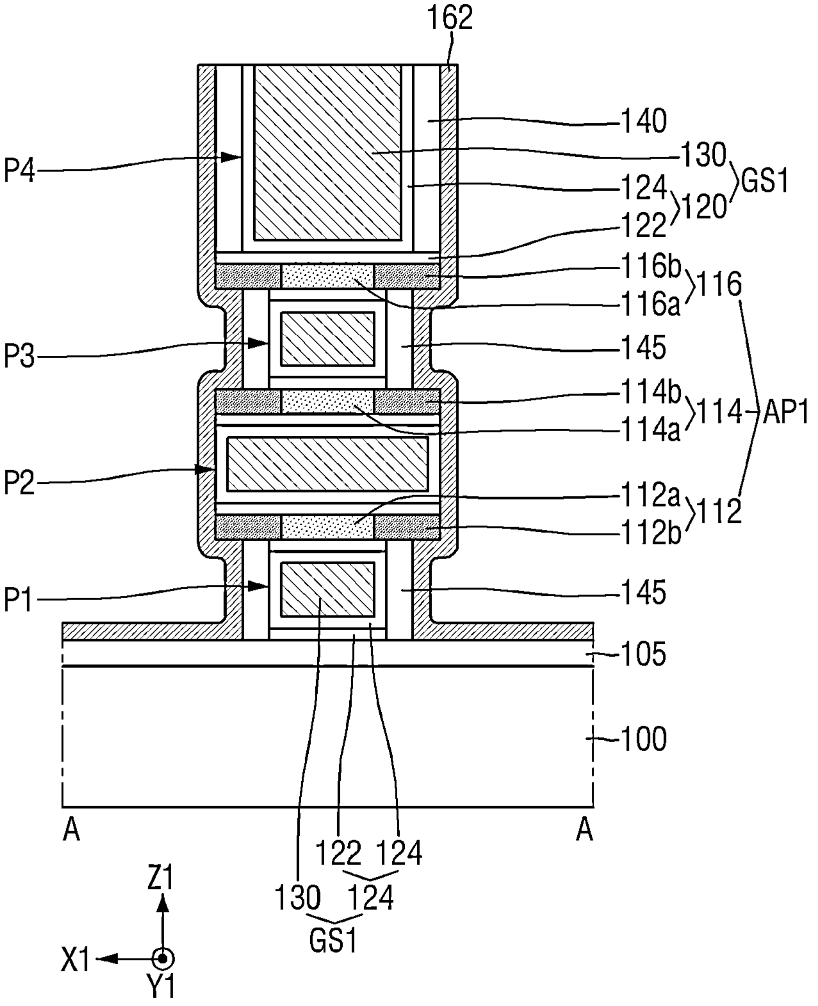
FIG. 31 is a cross-sectional view illustrating an intermediate step of a method of fabricating a semiconductor device according to example embodiments of the present disclosure.

FIG. 31 is a cross-sectional view illustrating an intermediate step of a method of fabricating a semiconductor device according to example embodiments of the present disclosure. For convenience, the embodiment of FIG. 31 will hereinafter be described, focusing mainly on the differences with the embodiments of FIGS. 1 to 30. Specifically, FIG. 31 illustrates an intermediate step to be performed after the step illustrated in FIG. 30.

Referring to FIG. 31, a contact insertion film 162 is formed.

The contact insertion film 162 may surround the end portions of each of the channel layers 112, 114, and 116. For example, the contact insertion film 162 may extend along the outer surfaces of the first gate spacers 140, the first inner spacers 145, and the first gate dielectric film 120 and along the first contact portions 112*b*, 114*b*, and 116*b* of the channel layers 112, 114, and 116. The contact insertion film 162 may extend further along the upper surface of the first separation insulating film 105.

The contact insertion film 162 may form ohmic contacts by being in contact with the end portions of each of the channel layers 112, 114, and 116. The contact insertion film 162, which forms ohmic junctions with the channel layers 112, 114, and 116, may include, for example, a semimetal material.

Thereafter, referring to FIG. 9, a contact filling film 164 is formed on the contact insertion film 162. In this manner, the semiconductor device of FIG. 9 can be fabricated.

Figure 32:
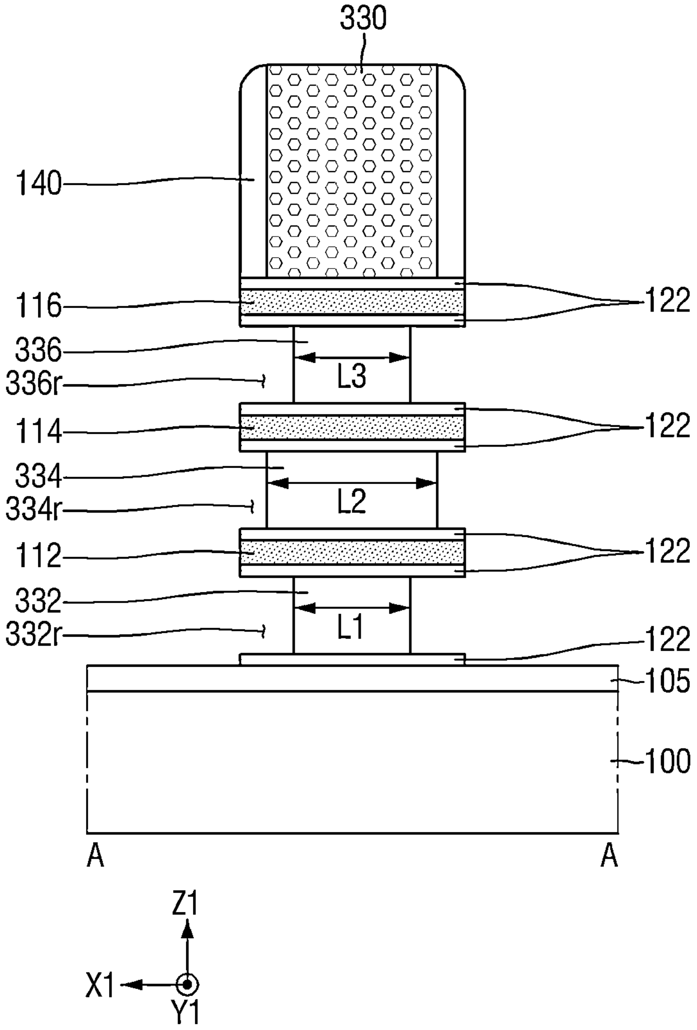
FIGS. 32 to 34 are cross-sectional views illustrating intermediate steps of a method of fabricating a semiconductor device according to example embodiments of the present disclosure.
Figure 33:
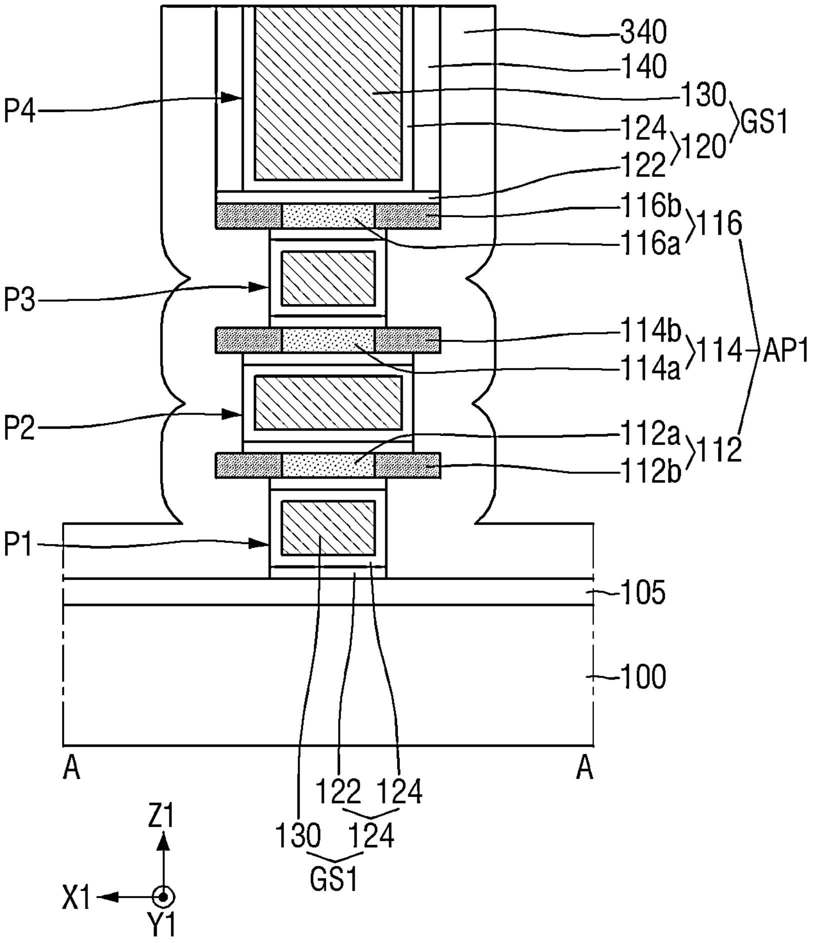
Figure 34:
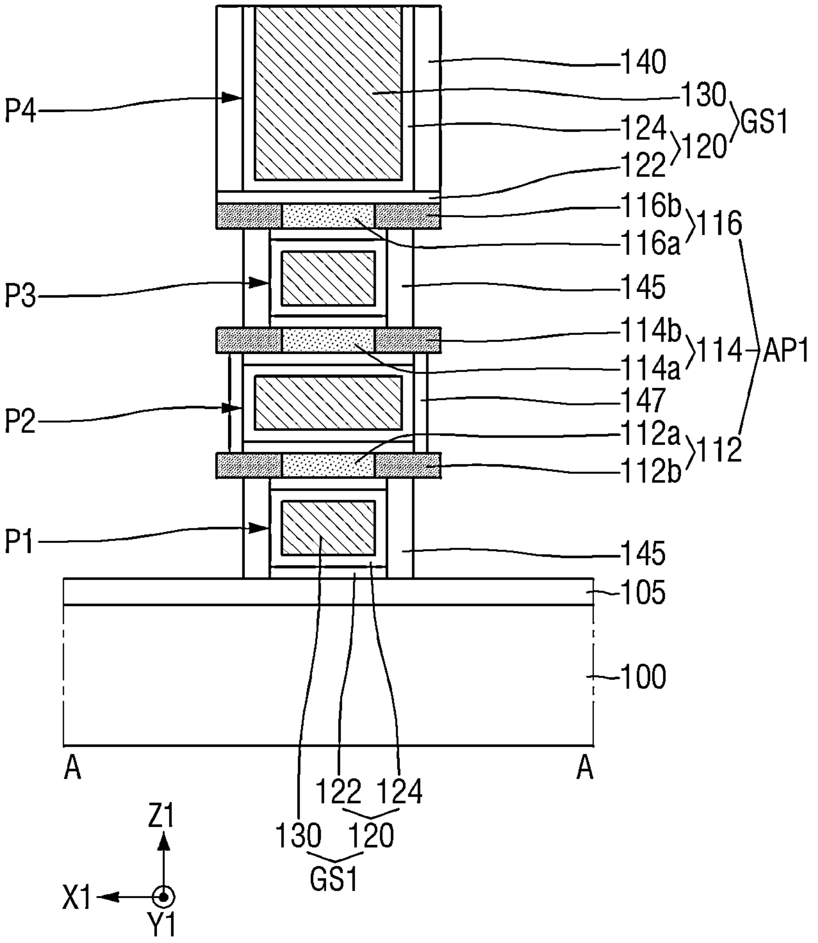

FIGS. 32 to 34 are cross-sectional views illustrating intermediate steps of a method of fabricating a semiconductor device according to example embodiments of the present disclosure. For convenience, the embodiment of FIGS. 32 to 34 will hereinafter be described, focusing mainly on the differences with the embodiments of FIGS. 1 to 30. Specifically, FIGS. 32 to 34 illustrate intermediate steps to be performed after the step illustrated in FIG. 21.

Referring to FIG. 32, a first recess process is performed on the sacrificial layers 332, 334, and 336.

As the first recess process is performed, the sacrificial layers 332, 334, and 336 may be selectively recessed. For example, a first length L1 in the first direction X1 of the first sacrificial layer 332 and a third length L3 in the first direction X1 of the third sacrificial layer 336 may be less than a second length L2 in the first direction X1 of the second sacrificial layer 334. In some embodiments, the sacrificial layers 332, 334, and 336 may include recesses 332*r*, 334*r*, and 336*r*. For example, recesses 332*r* of the first sacrificial layer 332 and recesses 336*r* of the third sacrificial layer 336 may be deeper than recesses 334*r* of the second sacrificial layer 334.

Referring to FIG. 33, a spacer film 340 is formed. For example, the steps described above with reference to FIGS. 23 to 29 may be performed.

Referring to FIG. 34, a third recess process is performed on the spacer film 340.

As the third recess process is performed, first inner spacers 145 may be formed on the side surfaces of each part of the first gate structure GS1 having a relatively large gate length. For example, the first inner spacers 145 may be formed on the side surfaces of each of the first and third gate portions P1 and P3, and second inner spacers 147 may be formed on the side surfaces of the second gate portion P2.

In some embodiments, the thickness of the second inner spacers 147 may be less than the thickness of the first inner spacers 145 because the side surfaces of part of the first gate structure GS1 where the second inner spacers 147 are formed (e.g., the side surfaces of the second gate portion P2) protrude beyond the side surfaces of part of the first gate structure GS1 where the first inner spacers 145 are formed (e.g., the side surfaces of the first or third gate portion P1 or P3).

Thereafter, referring to FIG. 10, first source/drain contacts 160 are formed. In this manner, the semiconductor device of FIG. 10 can be fabricated.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A semiconductor device comprising:

a substrate;

a first channel layer on the substrate, the first channel layer extending in a first direction while being spaced apart from the substrate, and including a two-dimensional (2D) semiconductor material;

a second channel layer on the first channel layer, the second channel layer extending in the first direction while being spaced apart from the first channel layer, and including the 2D semiconductor material;

a gate structure on the substrate, the gate structure extending in a second direction, which is perpendicular to the first direction, and being penetrated by the first and second channel layers; and source/drain contacts on side surfaces of the gate structure, the source/drain contacts being connected to the first and second channel layers, wherein the gate structure includes a first gate portion, which is between the substrate and the first channel layer and has a first gate length, a second gate portion, which is between the first and second channel layers and has a second gate length, and a third gate portion, which is on an upper surface of the second channel layer and has a third gate length, wherein the first and third gate lengths are greater than, or less than, the second gate length, and wherein a length of one of the first and second channel layers in the first direction is equal to a length of at least one of the first, second, and third gate portions in the first direction.

2. The semiconductor device of claim 1, wherein each of the first and second channel layers includes horizontal contact surfaces, which are parallel to an upper surface of the substrate and are in contact with the source/drain contacts, and vertical contact surfaces, which are perpendicular to the first direction and are in contact with the source/drain contacts.

3. The semiconductor device of claim 1, wherein the gate structure includes a gate dielectric film, which surrounds each of the first and second channel layers, and a gate electrode, which is stacked on the gate dielectric film.

4. The semiconductor device of claim 3, wherein the gate dielectric film includes a first sub-dielectric film, which surrounds each of the first and second channel layers and is not interposed between the gate electrode and the source/drain contacts, and a second sub-dielectric film, which surrounds the first sub-dielectric film and is interposed in part between the gate electrode and the source/drain contacts.

5. The semiconductor device of claim 1, wherein each of the first and second channel layers includes a central portion, which includes the 2D semiconductor material, and contact portions, which are at both end portions of the central portion and include the 2D semiconductor material doped with impurities.

6. The semiconductor device of claim 5, wherein the 2D semiconductor material includes a transition metal dichalcogenide (TMD).

7. The semiconductor device of claim 1, further comprising:

a separation insulating film interposed between the substrate and the gate structure and between the substrate and the source/drain contacts.

8. The semiconductor device of claim 1, wherein each of the source/drain contacts includes a contact insertion film and a contact filling film, which are sequentially stacked on side surfaces of the gate structure, and wherein each of the first and second channel layers form ohmic contacts with the contact insertion film.

9. The semiconductor device of claim 8, wherein the contact insertion film includes a semimetal material.

10. A semiconductor device comprising:

a substrate;

a channel layer on the substrate, the channel layer extending in a first direction while being spaced apart from the substrate, and including a two-dimensional (2D) semiconductor material;

a gate structure on the substrate, the gate structure extending in a second direction, which is perpendicular to the first direction, and being penetrated by the channel layer; and source/drain contacts on side surfaces of the gate structure, the source/drain contacts being connected to the channel layer, wherein the gate structure includes a first gate portion, which is on a bottom surface of the channel layer and has a first gate length, and a second gate portion, which is on an upper surface of the channel layer and has a second gate length greater than the first gate length, wherein the bottom surface of the channel layer includes first horizontal contact surfaces, which are exposed by the first gate portion and are in contact with the source/drain contacts, and wherein a length of the channel layer in the first direction is equal to a length of the first gate portion or the second gate portion in the first direction.

11. The semiconductor device of claim 10, wherein the 2D semiconductor material includes a transition metal dichalcogenide (TMD).

12. The semiconductor device of claim 10, wherein the channel layer includes back gate regions, which do not overlap with the first gate portion in a third direction perpendicular to an upper surface of the substrate and overlap with the second gate portion.

13. The semiconductor device of claim 12, wherein the back gate regions include the first horizontal contact surfaces.

14. The semiconductor device of claim 12, wherein the back gate regions include the 2D semiconductor material doped with impurities.

15. The semiconductor device of claim 10, wherein the upper surface of the channel layer is exposed by the second gate portion and includes second horizontal contact portions, which are in contact with the source/drain contacts.

16. The semiconductor device of claim 10, further comprising:

first inner spacers interposed between the first gate portion and the source/drain contacts.

17. The semiconductor device of claim 16, further comprising:

second inner spacers interposed between the second gate portion and the source/drain contacts, wherein a thickness of the first inner spacers is greater than a thickness of the second inner spacers.

18. A semiconductor device comprising:

a substrate;

first and second channel layers sequentially stacked on the substrate, spaced apart from each other, extending in a first direction, and including a two-dimensional (2D) semiconductor material;

a gate structure on the substrate, the gate structure extending in a second direction, which is perpendicular to the first direction, and being penetrated by the first and second channel layers;

gate spacers extending along side surfaces of the gate structure and being penetrated by the first and second channel layers; and source/drain contacts on side surfaces of the gate structure, the source/drain contacts including a metal material, wherein each of the first and second channel layers include contact portions, which include the 2D semiconductor material doped with impurities, wherein the gate structure includes first, second, and third gate portions, which are alternately arranged with the first and second channel layers in a third direction perpendicular to an upper surface of the substrate, wherein a first gate length of the first gate portion is less than a second length of the second gate portion, wherein the second gate length of the second gate portion is greater than a third gate length of the third gate portion, wherein the source/drain contacts are in contact with bottom surfaces of the contact portions of the first channel layer and upper surfaces of the contact portions of the second channel layer, and wherein a length of one of the first and second channel layers in the first direction is equal to a length of at least one of the first, second, and third gate portions in the first direction.

19. The semiconductor device of claim 18, further comprising:

first inner spacers interposed between the first gate portion and the source/drain contacts and between the third gate portion and the source/drain contacts.

20. The semiconductor device of claim 19, further comprising:

second inner spacers interposed between the second gate portion and the source/drain contacts, wherein a thickness of the first inner spacers is greater than a thickness of the second inner spacers.

* * * * *